United States Patent [19]
Larabell et al.

[11] Patent Number: 5,471,099
[45] Date of Patent: Nov. 28, 1995

[54] MODULAR ENCLOSURE APPARATUS

[75] Inventors: Henri J. Larabell, Cupertino; Richard S. Davis, Palo Alto, both of Calif.

[73] Assignee: HJS&E Engineering, Sunnyvale, Calif.

[21] Appl. No.: 977,297

[22] Filed: Nov. 16, 1992

[51] Int. Cl.[6] .................................................. H05K 7/20
[52] U.S. Cl. ............................ 307/53; 361/690; 361/694; 361/695
[58] Field of Search ................................. 361/382–384, 361/690–695; 307/53

[56]   References Cited

U.S. PATENT DOCUMENTS

| | | | |
|---|---|---|---|
| 4,074,146 | 2/1978 | Buonavita | 307/60 |
| 4,079,440 | 3/1978 | Ohnuma | 361/424 |
| 4,858,070 | 8/1989 | Buron et al. | 361/384 |
| 4,860,163 | 8/1989 | Sarath | 361/384 |
| 4,870,863 | 9/1989 | Duncan et al. | 73/431 |
| 4,894,749 | 1/1990 | Elko et al. | 361/383 |
| 4,931,904 | 6/1990 | Yiu | 361/384 |
| 4,941,841 | 7/1990 | Darden et al. | 439/377 |
| 4,960,384 | 10/1990 | Singer et al. | 439/155 |
| 5,057,968 | 9/1991 | Morrison | 361/385 |
| 5,243,493 | 9/1993 | Jeng et al. | 361/690 |

OTHER PUBLICATIONS

Anderson et al, "Volatile Memory Retention", IBM TDB, vol. 14, No. 9, Feb. 1972.

*Primary Examiner*—Thomas M. Dougherty
*Assistant Examiner*—Aditya Krishnan
*Attorney, Agent, or Firm*—Douglas A. Chaikin

[57]   ABSTRACT

Disclosed herein is a modular enclosure apparatus for personal computers and/or work stations having a plurality of removable and replaceable modules. These modules include a cooling module for cooling the enclosure; a memory storage device module having a plurality of mating slides and carriers for routine installation and removal of each memory storage device; and a power supply module for providing power to the enclosure. In a RAID embodiment, the modular enclosure apparatus includes a RAID controller module which is similarly removable and replaceable. Each of the modules may include a circuit interrupt assembly for disabling individual modules (by cutting off power to the desired module) and allowing that module or parts contained therein to be removed while the power is disabled only to the module desired and the remaining modules continue to be enabled.

29 Claims, 18 Drawing Sheets

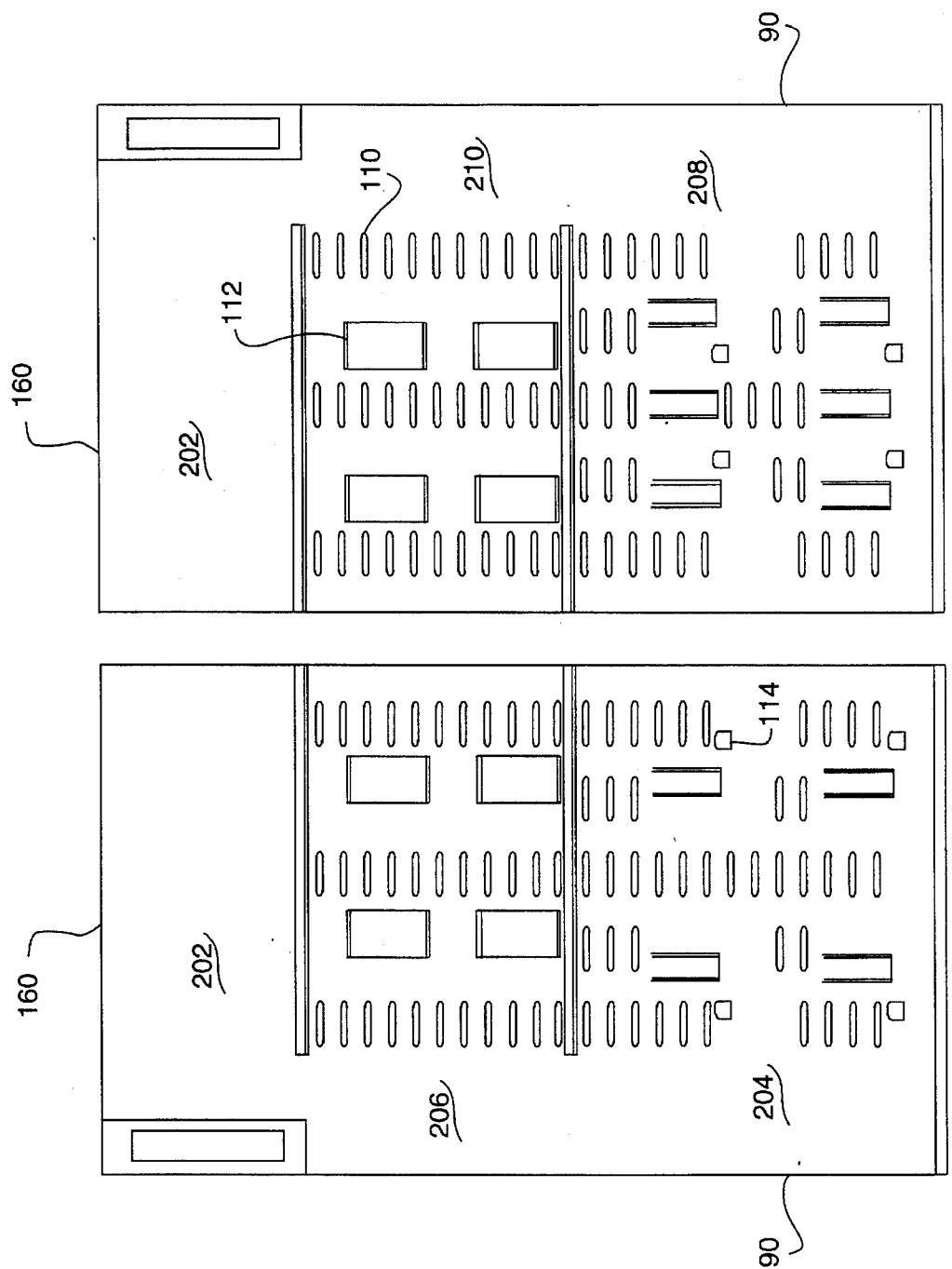

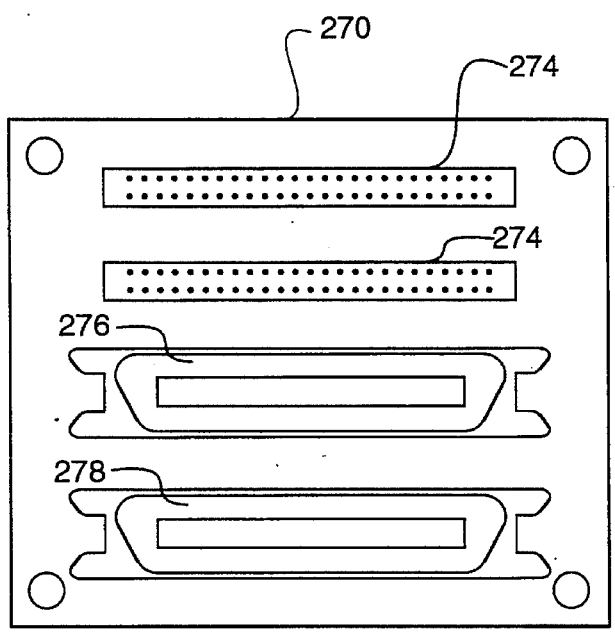 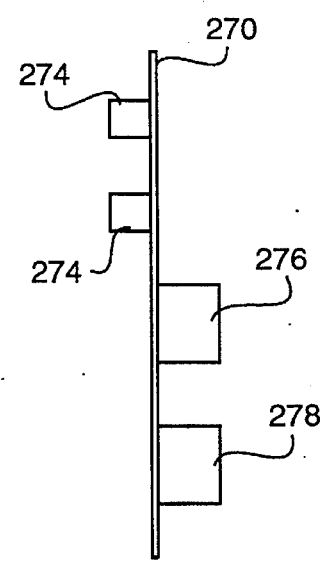
FIG. 12       FIG. 13

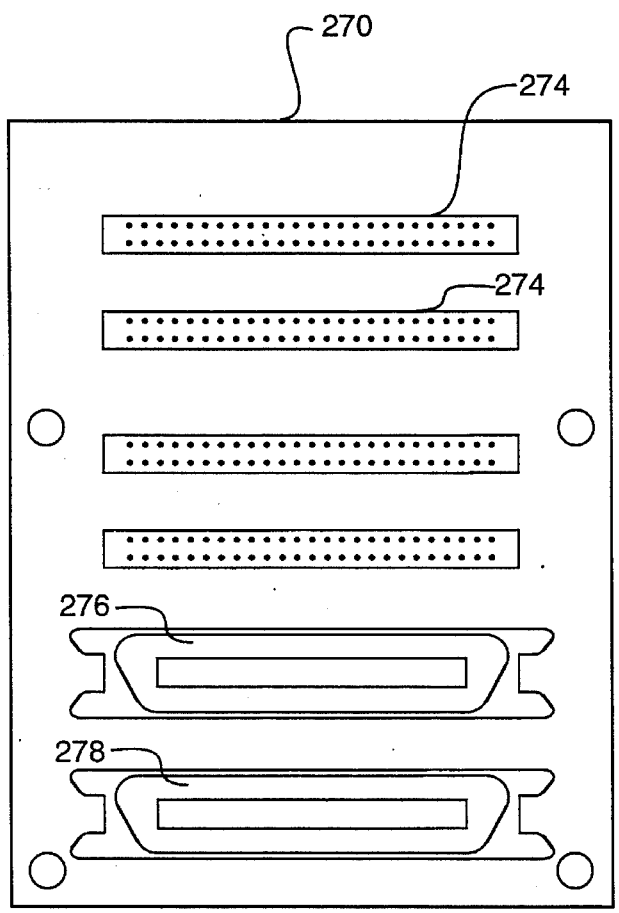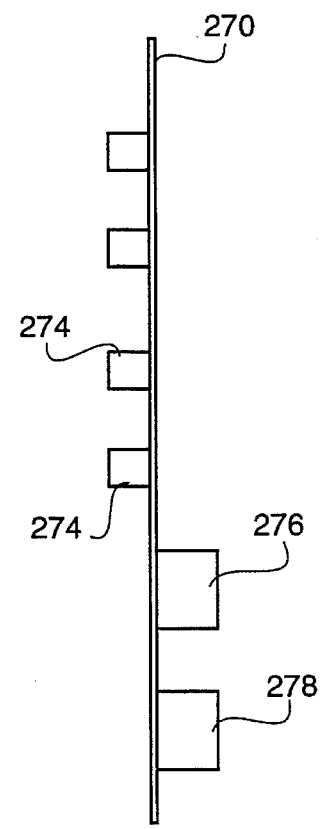
FIG. 14  FIG. 15

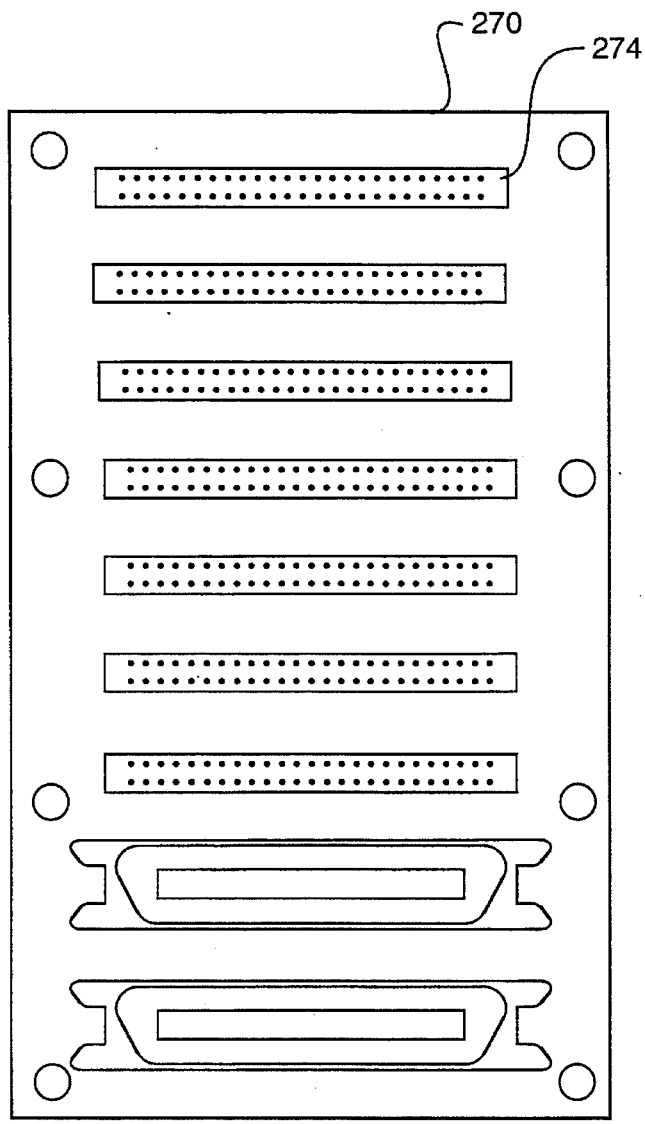 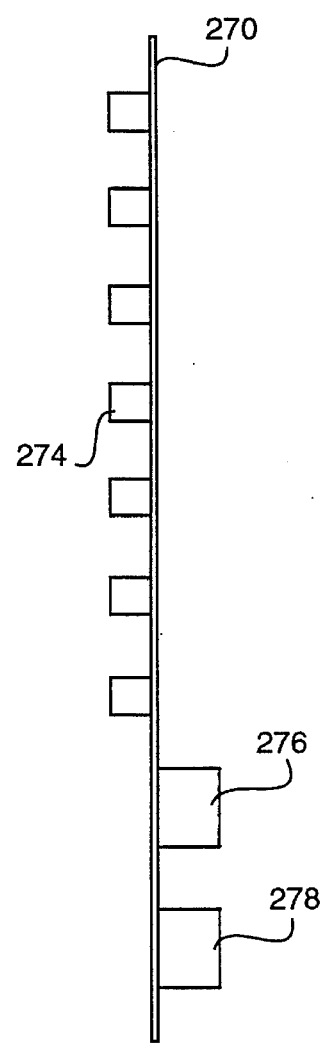
FIG. 16
FIG. 17

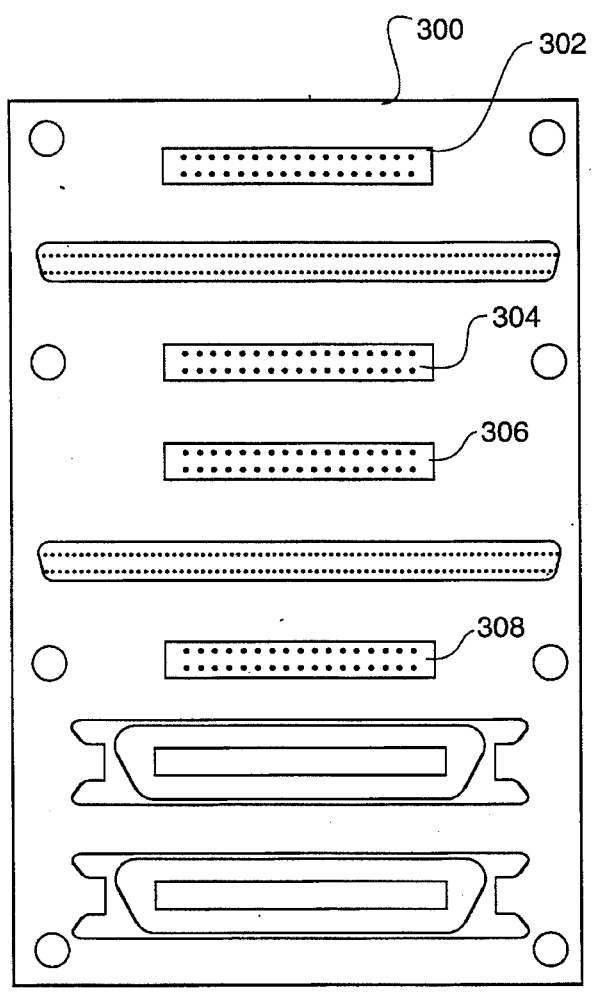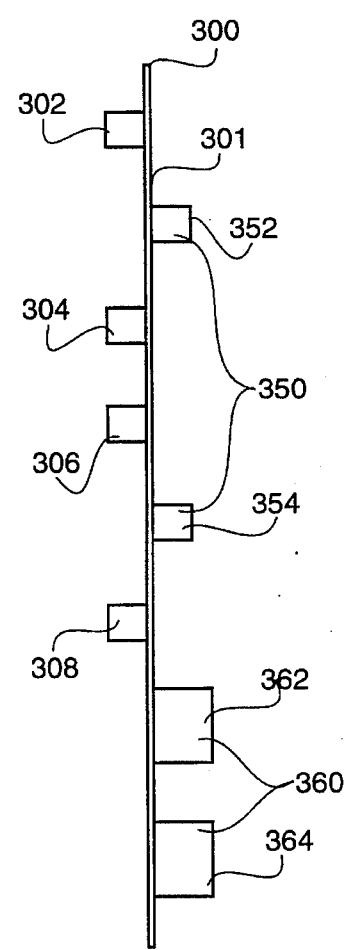
FIG. 18  FIG. 19

MODULAR ENCLOSURE APPARATUS

BACKGROUND OF THE INVENTION

1. Field of the Invention

This invention relates to a computer peripheral enclosure for small computer systems such as personal computers or work stations and more particularly, to such enclosures that are capable of storing a plurality of electrical devices such as memory storage devices and the like wherein the electrical devices are removable and replaceable.

2. Previous Art

All electrical devices have inherently finite lifetimes. That lifetime, sometimes expressed as the mean time before failure (MTBF), is influenced by many factors.

A great number of the factors that influence the MTBF are beyond the control of the computer system. Almost invariably, failure of the peripheral device occurs before the computer fails. Failures are common in devices that have moving parts such as disk drives, cooling fans and the like, whereas failure of solid state components such as computer mother boards do occur but are far less common.

The only predictable characteristic of electrical devices or equipment is that, at some time, they will fail, particularly those with moving parts. Critical applications cannot afford the down-time caused by device failure or the loss of information that may result from component failure. If a power supply fails, in a typical computer system, the computer must be powered down, its housing opened, its power supply detached, replaced and/or repaired as appropriate, and then the computer system reassembled.

Unless a skilled technician is on hand to make the power supply replacement the down time can be lengthy and costly. In some cases, electrical device failure will also result in a loss of data being written to a memory storage device when the failure occurs. That data could be completely lost, or incompletely or incorrectly recorded. If a hard disk drive fails during use, not only is the data being recorded in jeopardy, the previously recorded data is also at risk. Since hard disk drives are available today that have capacities in the range of 2 giga-bytes (GB), losses of that amount of data on a hard disk drive translates into a great loss of time and effort.

Systems that have redundant electrical devices, such as the Redundant Array of Inexpensive Disk Drives (RAID), minimize the loss of data still have a down time problem. In conventional redundant systems, the theory is that replacement of failed devices can be postponed until the computer system would normally not be operating and thus minimize down time. Of course, like all theories, this one too is not always realized.

A RAID sub-system may typically have up to 2.5 GB storage capacity and have five memory storage devices. Of course it is possible for a RAID system to have more or less than five memory storage devices. And, it is believed that as the concept of RAID develops and becomes more widely accepted other variations are possible, if not likely.

Electrical devices associated with personal computers will fail. When failure occurs, the non-operating components must be removed and repaired and/or replaced. Since component failure is inevitable, there has been a long felt need to create a system that takes component failure into account and facilitates removal and replacement of the failed devices and minimizes down-time.

"Small" computer systems are distinguished from "sub-systems" or modules of this invention in that a "small" computer system is a complete operating computer whereas a "sub-system" is not a computer but a modular component for use with a computer system. A "small" computer system may use a SCSI controller. In this embodiment of a small computer system, the system may have up to eight memory storage devices. Typically these devices are memory storage devices permanently installed in the computer housing.

The term "personal computers" includes, but is not limited to, personal computers such as IBM personal computers, IBM compatible computers, Apple computers and the like.

Personal computers are different than work stations. Work stations are typified by the Sun work-stations. Work stations are generally intended for scientific work such as chip layout and the like. Work stations operate at far greater capacities and speeds than personal computers.

There has also been a long felt need to create a computer system, which, to the maximum extent possible, prevents the loss of data and extends the MTBF.

It will be fully appreciated by even relatively novice users that there is a critical unsatisfied need for a system of modular and replaceable sub-systems.

Additionally, it would be quite desirable for such a system of modular and replaceable sub-systems to be combined with a redundant system such as the (RAID) system to avoid the loss of operational time as well as data.

SUMMARY OF THE INVENTION

It is an object of this invention to provide a modular enclosure apparatus for electrical devices for connection to small computer systems, which includes modules that are routinely removable.

It is a further object of this invention to provide a modular enclosure apparatus described above, wherein there are modules for all the computer's main sub-systems including power, memory, cooling and in the case of a RAID system a controller module.

It is a yet further object of this invention to provide such a modular enclosure apparatus which is both economical and efficient.

In accordance with the above objects and those that will be mentioned and will become apparent below, the modular enclosure apparatus in accordance with this invention, comprises:

a housing having a base, upstanding side walls, a back and a top;

a cooling module removably connected to the enclosure for cooling the enclosure;

a frame removably connected to the housing, the frame including:

means for mounting a plurality of electrical devices within the frame;

a memory storage device module removably connected to the frame, the memory storage device module including means for removably connecting at least one memory storage device;

a power supply module removably connected to the frame, the power supply module including power supply means for supplying power to the enclosure;

first interconnect means for connecting the enclosure to the computer bus;

second interconnect means for connecting the memory storage device module to the first interconnect means; and third interconnect means for connecting the power supply module to the cooling module and the memory storage device module, whereby, each of the modules is removably connected, allowing any of the modules to be removed and replaced.

The modular enclosure apparatus in accordance with this invention, provides in one embodiment an electrical interrupt switch for each of the modules. By use of the electrical interrupt switch, a small computer system can remain operational, while its modules are removed. The modules may be repaired and/or replaced as appropriate without incurring down time foe the remainder of the small computer system.

In a preferred embodiment, the memory storage device module includes at least one memory storage device slide semi-permanently mounted in the frame and at least one carrier adapted for removable connection with the slide. As described in detail with respect to Applicant's concurrently filed patent application for a universal bracket assembly, which is specifically incorporated herein by reference, the carrier is adapted for connection with the memory storage device. U.S. application No. 07/976,416, filed Nov. 16, 1992, entitled "Universal Slide Mounted Adaptor for Storage Devices", and U.S. Continuation-in-part Application, No. 08/157,675, filed Nov. 24, 1993, having the same title.

The slide of this embodiment includes an electrical interrupt switch for allowing each of the carriers to be removed from the housing without affecting the other memory storage devices present in the enclosure. If desired these other memory storage devices continue operating. Thus, each of the memory storage devices defines a hot swappable memory storage device.

The power supply module includes one or more power supplies. In a preferred embodiment, each of the power supplies include a circuit interrupt means for allowing each of the power supplies to be removed from the housing while the remaining power supplies continue operation; defining a hot swappable power supply module.

The cooling module includes cooling means for cooling the enclosure and cooling circuit means connected to the third interconnect means for supplying power to the cooling module. The cooling circuit means includes temperature sensing means for sensing the temperature of the enclosure and circuit interrupt means for interrupting the circuit. As will be appreciated from the description above, the cooling means may be shut off before it is removed from the enclosure.

In a preferred embodiment of the enclosure in accordance with this invention, the cooling module is removably connected to the back of housing. The back of the housing comprises a removable back assembly enabling the cooling module to be accessed without having to remove any other element of the modular enclosure apparatus in accordance with this invention.

In another preferred embodiment of the modular enclosure apparatus in accordance with this invention, power supply module includes a plurality of power supplies which are all less than 150 watts and preferably 100 watts.

In a preferred embodiment of the modular enclosure apparatus especially well suited to a RAID system, the modular enclosure apparatus, comprises:

a housing having a base, upstanding side walls, a back and a top;

a cooling module removably connected to the enclosure for cooling the enclosure;

a frame removably connected to the housing, the frame including:

means for mounting a plurality of electrical devices within the frame;

a memory storage device module removably connected to the frame, the memory storage device module including means for removably connecting at least one memory storage device;

a power supply module removably connected to the frame, the power supply module including power supply means for supplying power to the enclosure;

a RAID controller module removably connected to the frame, the RAID controller module includes controller module for enabling the computer means to control each of the electrical devices;

first interconnect means for connecting the enclosure to the computer bus;

second interconnect means for connecting the memory storage device module to the first interconnect means; and third interconnect means for connecting the power supply module to the cooling module and the memory storage device module, whereby, each of the modules is removably connected, allowing any of the modules to be removed and replaced.

In a preferred RAID enclosure embodiment, the controller module includes circuit interrupt means and allows the controller itself to be hot swappable.

In order to be successful in the market place, both the RAID and Non-RAID embodiments must be able to fit on a desk top. Therefore, it can not be emphasized enough that all of the above features in order to be useful in the environment demanded by the users must conform to certain critical physical dimensions. These dimensions include the ability to fit on a desk top. Therefore, the modular enclosure apparatus in accordance with this invention has a length of between 6.6" and 12.0"; a height of between 12.4" and 15.0" and a width of between 7.5" and 10.75".

It is an advantage of this invention to provide a modular enclosure apparatus for electrical devices for connection to personal computers in such a manner that they may be easily removed and installed.

It is another advantage of the invention to provide a modular enclosure for electrical devices that may be easily removed, installed and reinstalled and have function sharing capacity.

It is another advantage of the invention to provide a housing for bracket assemblies to facilitate removal and installation of a variety of different electrical devices.

It is yet another advantage of this invention to provide a housing for bracket assemblies to facilitate removal and installation of a variety of different SCSI computer devices into and out of a computer system while that system is operational.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein:

FIG. 4 is a cross sectional view of the frame of FIG. 3 taken along line 4—4 and looking in the direction of the arrows.

FIG. 5 is a cross sectional view of the frame of FIG. 3 taken along line 5—5 and looking in the direction of the arrows.

FIGS. 12–13 are schematic representations of the data cable connection for the 2 device embodiment of the modular enclosure apparatus in accordance with this invention.

FIGS. 14–15 are schematic representations of the data cable connection for the 4 device embodiment of the modular enclosure apparatus in accordance with this invention.

FIGS. 16–17 are schematic representations of the data cable connection for the 7 device embodiment of the modular enclosure apparatus in accordance with this invention.

FIGS. 18–19 are schematic representations of the data cable connection for the 5 device RAID embodiment of the modular enclosure apparatus in accordance with this invention.

DETAILED DESCRIPTION OF THE INVENTION

Figure 1:
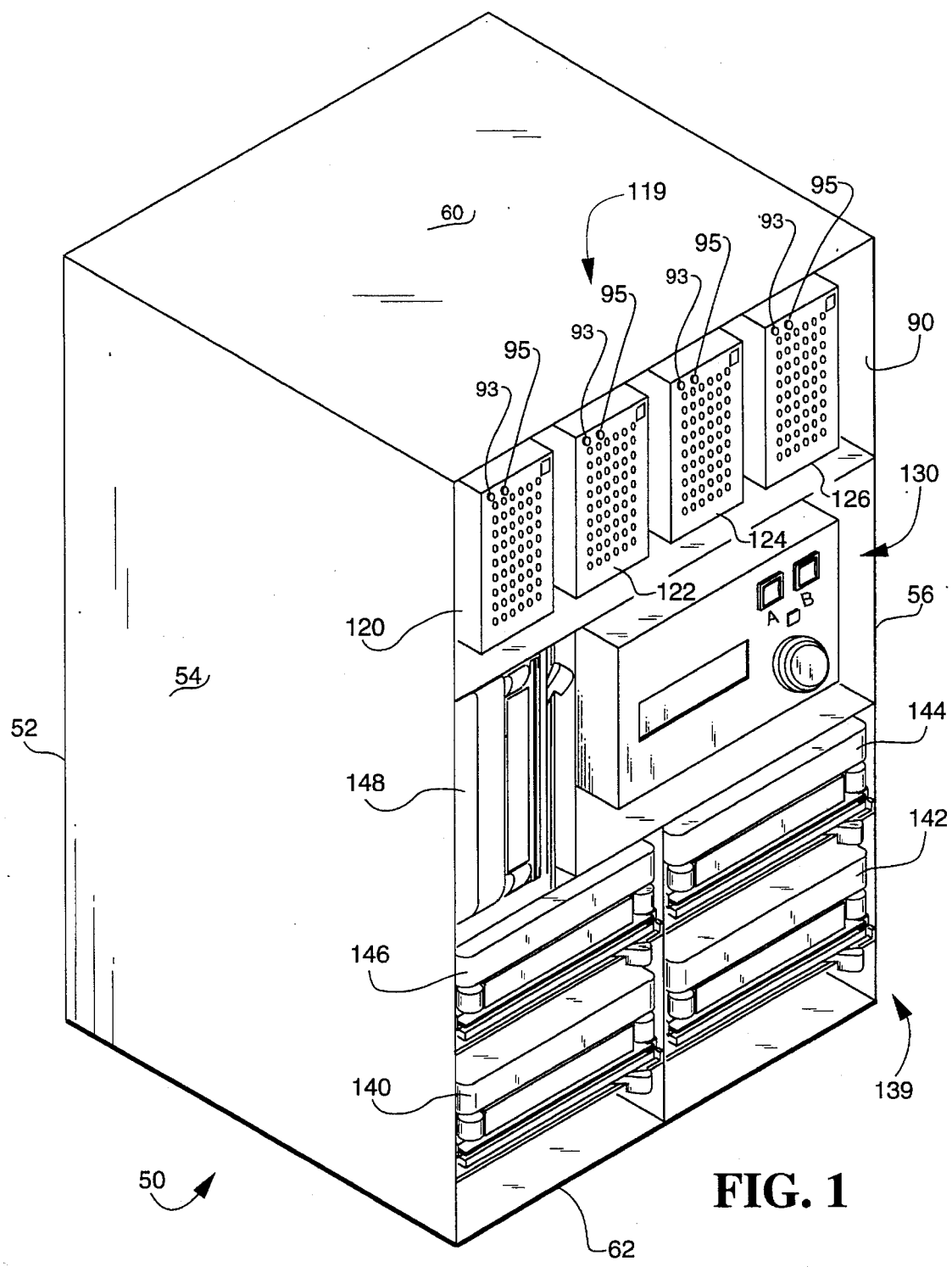
FIG. 1 is a front perspective view of the modular enclosure apparatus in accordance with this invention, illustrating the electrical devices installed in the enclosure.

The term "housing" as used herein means an essentially rigid, generally rectangular structure for containing a frame. The housing serves to protect the electrical devices mounted on the frame from exposure to external influences. Additionally, the housing can also serve as a means to attenuate electro-mechanical emissions originating within the frame mounted devices.

The term "frame" as used herein means an essentially rigid, generally rectangular structure for mounting various electrical and devices. The frame can be partitioned by means of horizontal and vertical dividers to create bays for mounting the desired devices. The frame will, typically, have slots, tabs and holes that are used or facilitate mounting of electronic devices onto the frame.

The term "electrical devices" as used herein, is used in a general sense and includes disk drives, controller means, switches, status indicators, circuit boards, cooling fans, power supplies, and the like.

The "universal bracket assembly" refers to and means to specifically incorporate by reference Applicant's concurrently filed application for said structure. U.S. Application, No. 07/976,416, filed Nov. 16, 1992, entitled "Universal Slide Mounted Adaptor for Storage Devices", and U.S. Continuation-in-part Application, No. 08/157,675, filed Nov. 24, 1993, having the same title. The universal bracket assembly includes the "slide" and "carrier" of said structure as set forth below.

The invention will now be described in detail with respect to FIG. 1, where there is shown the modular enclosure apparatus in accordance with this invention as generally denoted by the numeral 50. The enclosure 50 includes an open faced housing 52 and a frame 90 slideably connected to the housing 52.

The housing 52 is and has opposed upstanding walls 54 and 56. The housing 52 also has a removable back 58 (FIG. 2), a top 60 and a bottom 62.

The housing 52 of FIG. 1 is for the seven device embodiment shown in FIG. 1. The housing 52 has dimensions of 9.5" in width by 16" in height and by 14" in depth. The dimensions of the other embodiments will be described in detail below with reference to FIGS. 6–8, which illustrate the 2 and 4 device embodiments.

The housing 52 is made from aluminum with an epoxy powder coat finish.

The modular enclosure apparatus 50 includes a removable memory storage device module generally denoted by the numeral 139. The memory storage device module 139 includes a plurality of memory storage device assemblies 140, 142, 144, 146 and 148 removably connected to the frame 90.

The modular enclosure apparatus 50 includes a power supply module, generally denoted by the numeral 119. The power supply module 119 includes power supply assemblies 120, 122, 124 and 126 removably connected to the frame 90.

Each of the power supply assemblies 120, 122, 124 and 126 has two LEDs visible to the user, one LED 93 which allows the user to determine which assembly is the master and which the slave. And a second LED 95 which lights when the power supply assembly is in use.

The modular enclosure apparatus 50 is a RAID enclosure and as such includes a controller module, generally indicated by the numeral 130.

Figure 2:
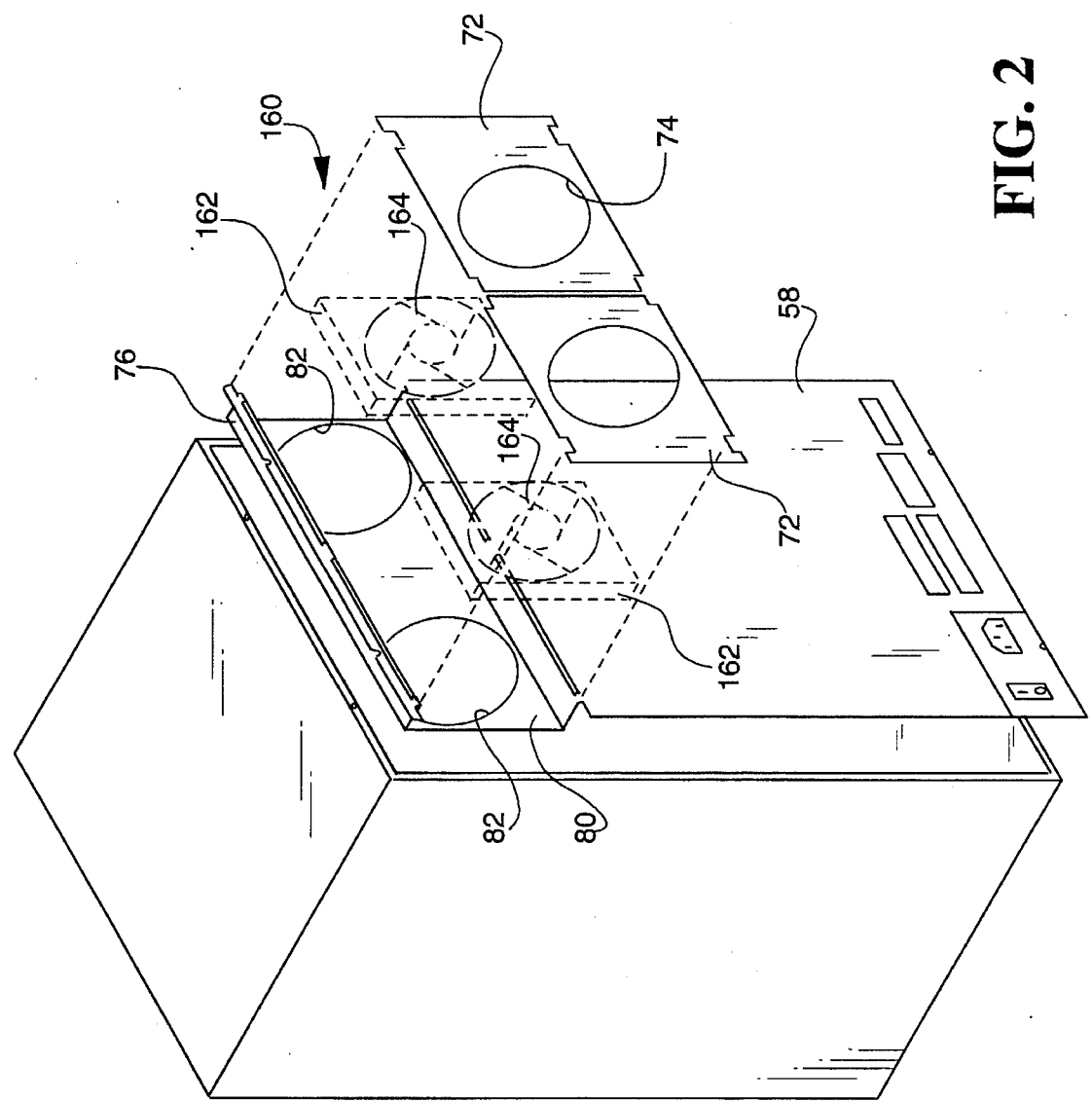
FIG. 2 is an exploded rear view of the modular enclosure apparatus of FIG. 1.

With respect to FIG. 2, there is shown the cooling module, generally indicated by the numeral 160. The cooling module 160 includes a plurality of fan assemblies 162 removably connected to the removable back 58.

Each of the fan assemblies 162 is removably connected to the back 58 as a result of the back 58 including removable fan cover panels 72 Removal of the fan assemblies 162 is accomplished by first removal of fan cover panels 72. As is seen from FIG. 2, the fan assemblies 162 are then accessible for removal.

The back 58 has step portion 80 having fan openings 82. The fan assemblies 162 sit within the step portion 80 and take heat out of the modular enclosure apparatus 50 through the fan openings 82.

It will be appreciated that the fan assemblies 162 include exhaust fans 164 and that fan cover panels 72 have openings 74 for exhausting the heat from the fans 164 therethrough.

Each of the fans 164 is a variable speed fan and has sufficient strength to cool the entire modular enclosure apparatus 50 by itself, if necessary, i.e. in the event of failure of one of the fan assemblies 162. In addition, the fans 164 may be as large as 120 mm and preferably 92

The back 58 is clipped onto the housing 52 through use of compatible mating clips 76. Each of the housing 52 and the back 58 includes similar mating clips.

The back 58 also has a plurality of openings for electrical connections as will be appreciated more fully hereinafter and particularly with reference to FIGS. 12–20.

The frame 90 also serves as part of the cooling module

160. As can be clearly seen the frame 90 has a plurality of openings 166 (FIG. 3) defining vents for cooling. These vents serve to allow hot air to flow therethrough and be exhausted as described above.

As will be described below with reference to FIGS. 21–24, the cooling module 160 includes an electrical circuit having a circuit interrupt for cutting power to the circuit. This allows either of the fan assemblies 162 to be removed as set forth above without affecting the operation of the other. In other words, fan assemblies 162 define hot swappable fan assemblies.

Figure 3:
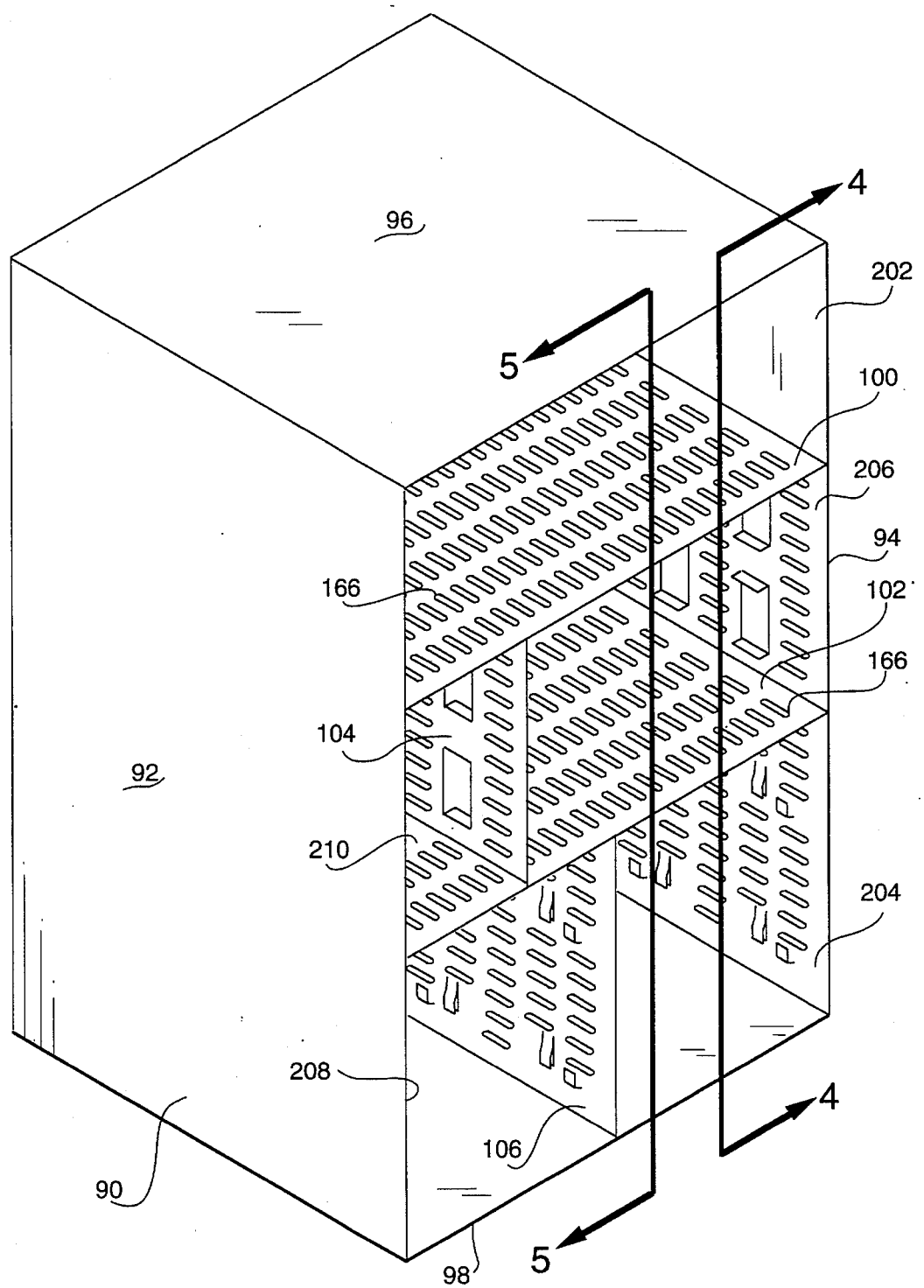
FIG. 3 is a perspective view of the frame of the modular enclosure apparatus of FIG. 1.

With respect to FIG. 3, there is shown the frame 90 having opposed side walls 92 and 94. The frame 90 has a top 96, and bottom 98. The walls 92 and 94 of frame 90 are partitioned into an upper bay 202 and a lower bay 204 by connecting horizontal partition 100 between side wall 92 and side wall 94. This upper bay 202 serves as the bay for installation of power supply assemblies 120, 122, 124 and 126.

Frame 90 includes a horizontal partition 102 and vertical partitions 104 and 106 which create additional bays 204, 206 and 210 for electrical devices including the memory storage device module 139 and the controller module 130.

With respect to FIGS. 4 and 5, there is the inside of the frame 90 and the bays 202–210. As shown, the bays 204 & 206 and 208 & 210 include a plurality of slots 110, tabs 112 and holes 114 for attaching the memory storage device module 139 as will be explained more fully with respect to FIGS. 9–11.

Figure 6:
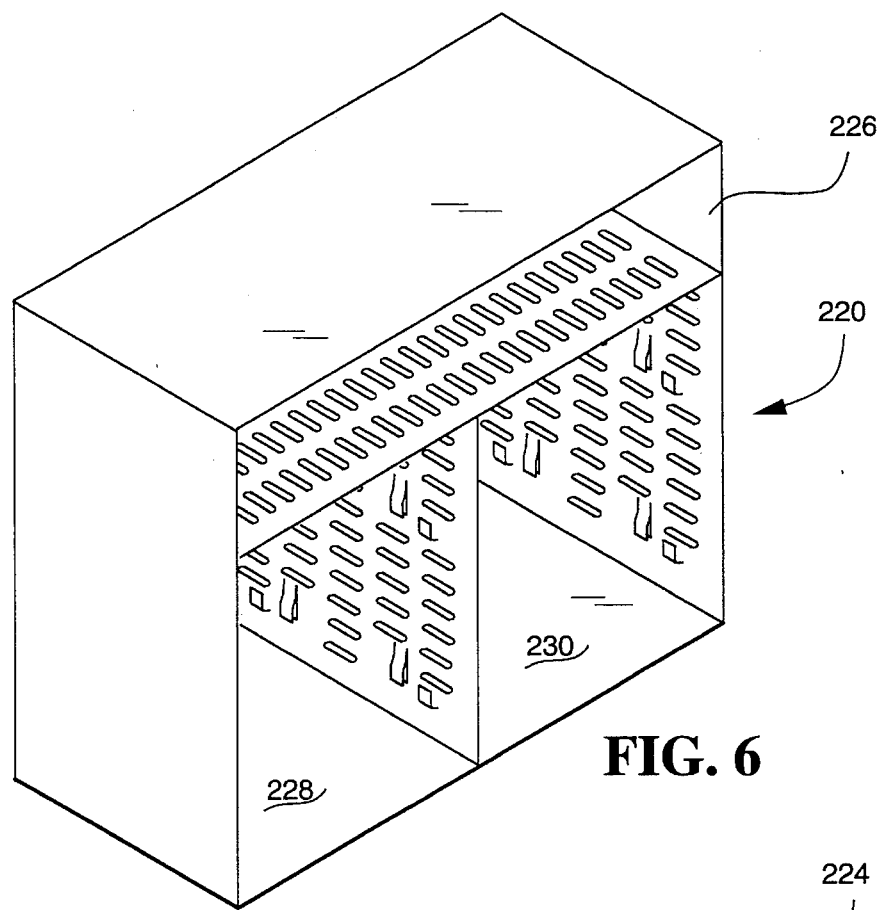
FIG. 6–8 are perspective views of alternate embodiments of the frame in accordance with this invention.
Figure 7:
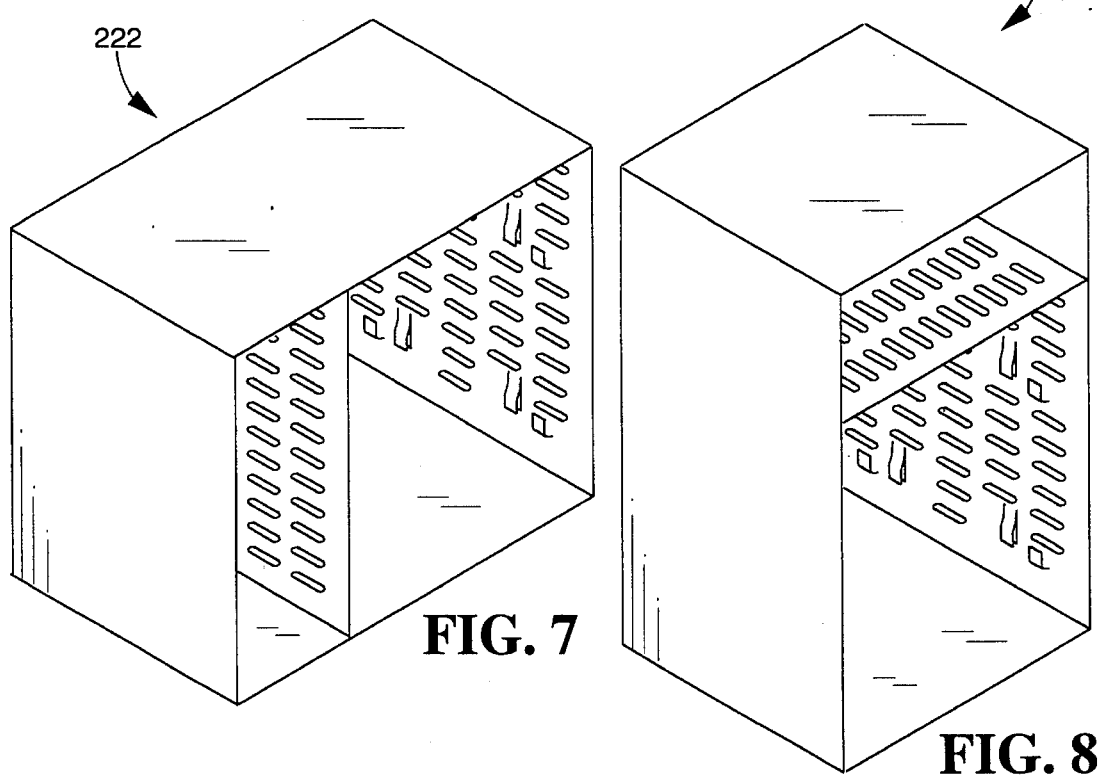
Figure 8:
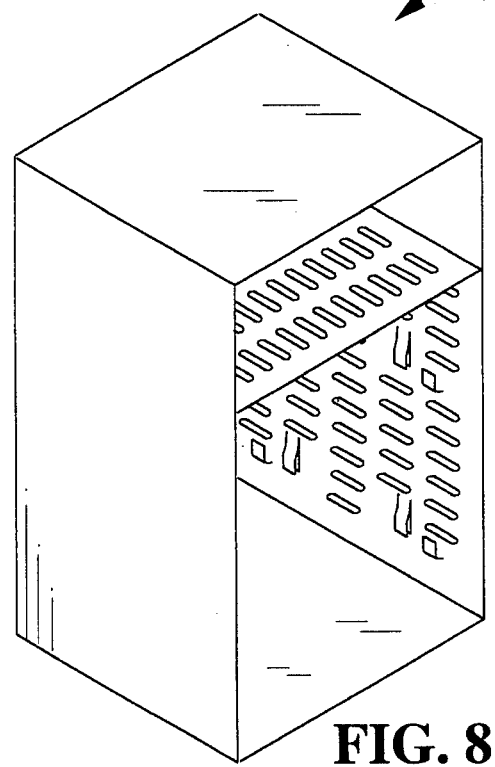

With respect to FIGS. 6–8, there are shown alternate embodiments of the modular enclosure apparatus in accordance with this invention, generally designated by the numerals 220, 222 and 224. The modular enclosure apparatus 220 is a four device embodiment. As will be appreciated, modular enclosure apparatus 220 has a plurality of bays 226, 228 and 230.

The bays 226, 228 and 230 are used as described above. It will be appreciated that different modules can be used in different bays depending on the user's specific needs.

The modular enclosure apparatus 222 of FIG. 7 is an alternative four device embodiment having dimensions of approximately 12.4" by 8.25" by 9.4". The modular enclosure apparatus 224 of FIG. 8 is a two device embodiment having dimensions of approximately 12.4" by 6.6" by 7". Each of these enclosures 222 and 224 are divided into bays as seen. As described with respect to FIG. 6, different modules can be used in different bays depending on the user's specific needs.

Figure 9:
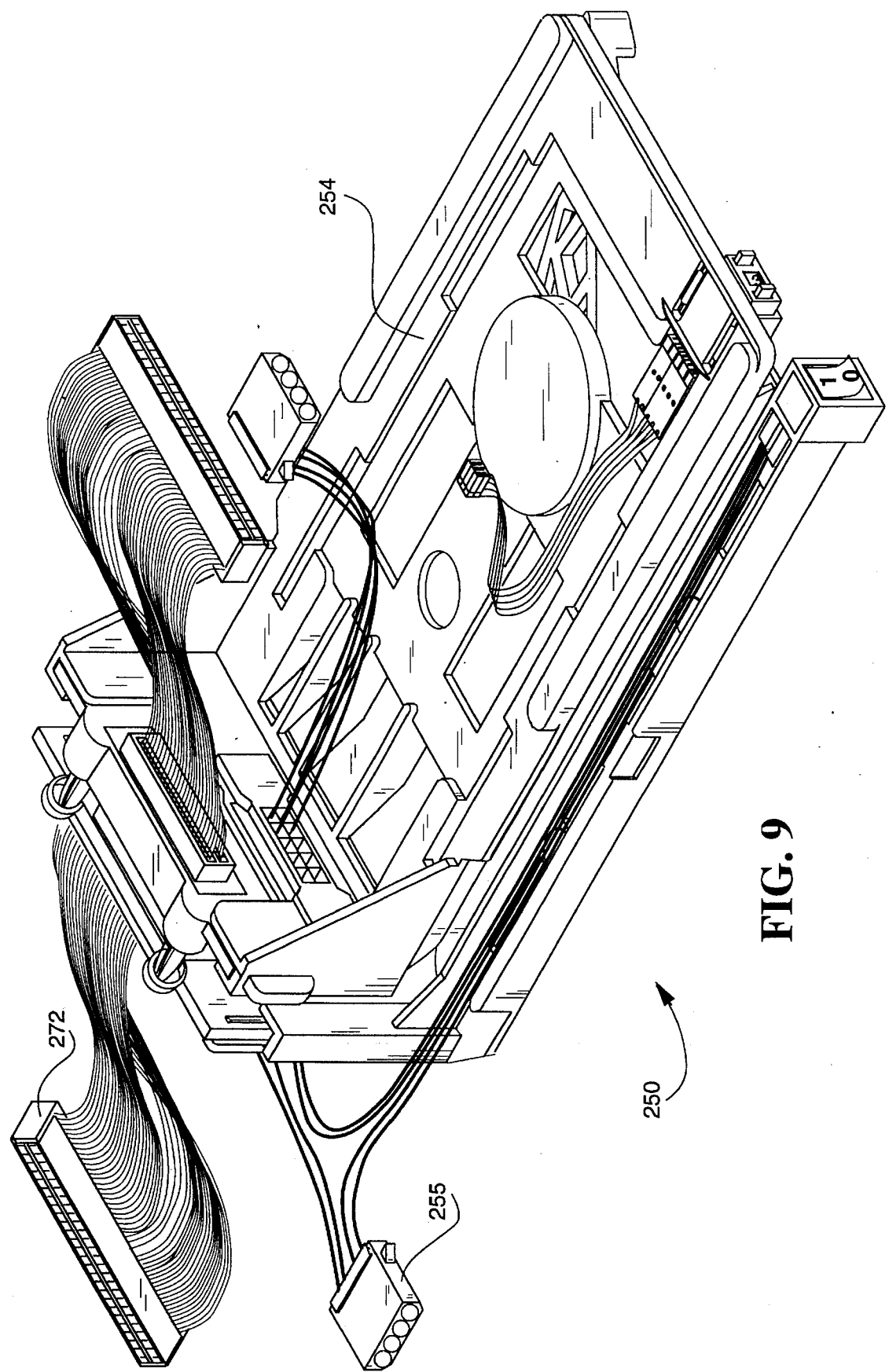
FIGS. 9–11 are perspective views of the universal bracket assembly in accordance with Applicant's other invention submitted concurrently herewith.
Figure 10:
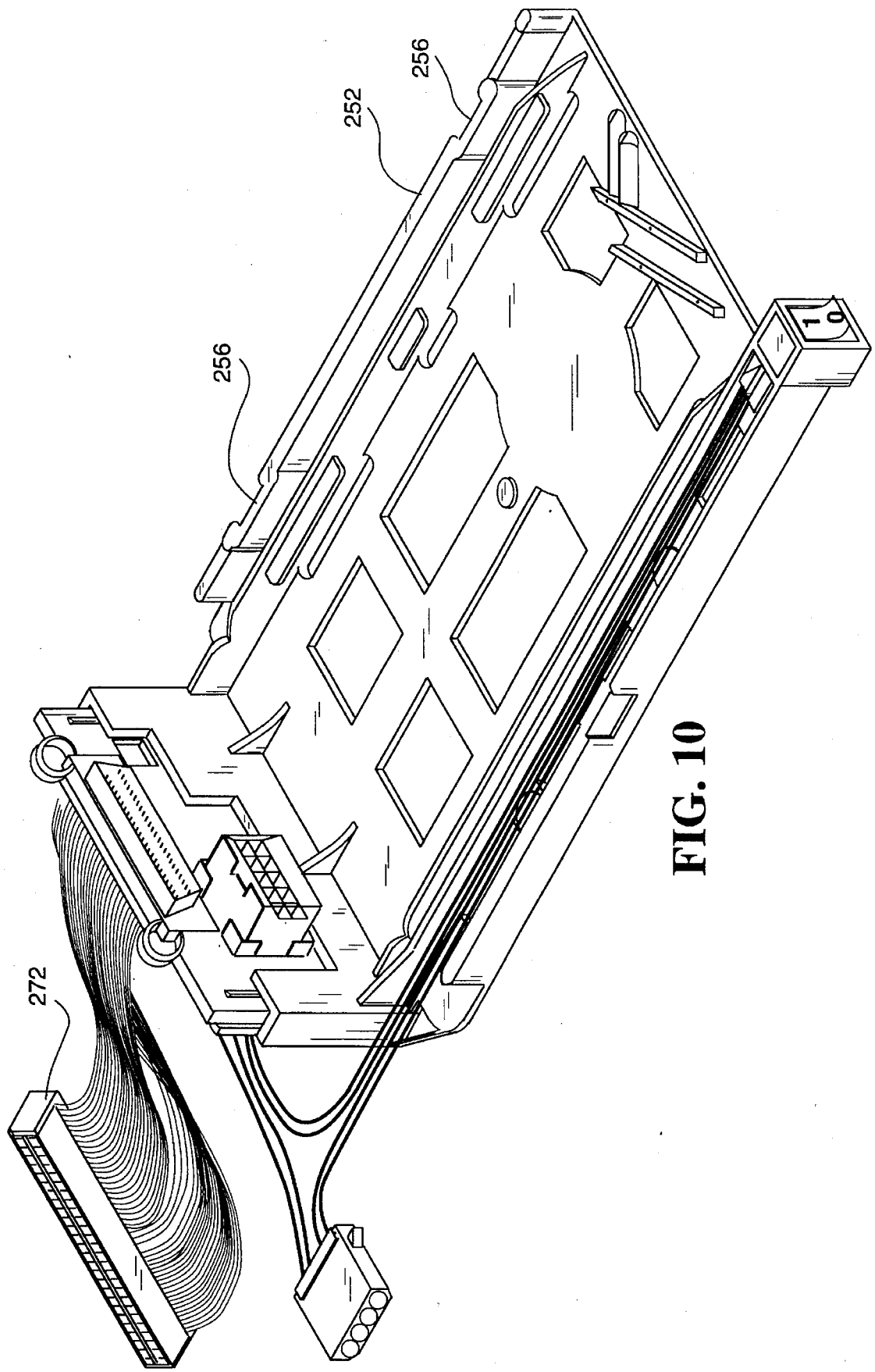
Figure 11:
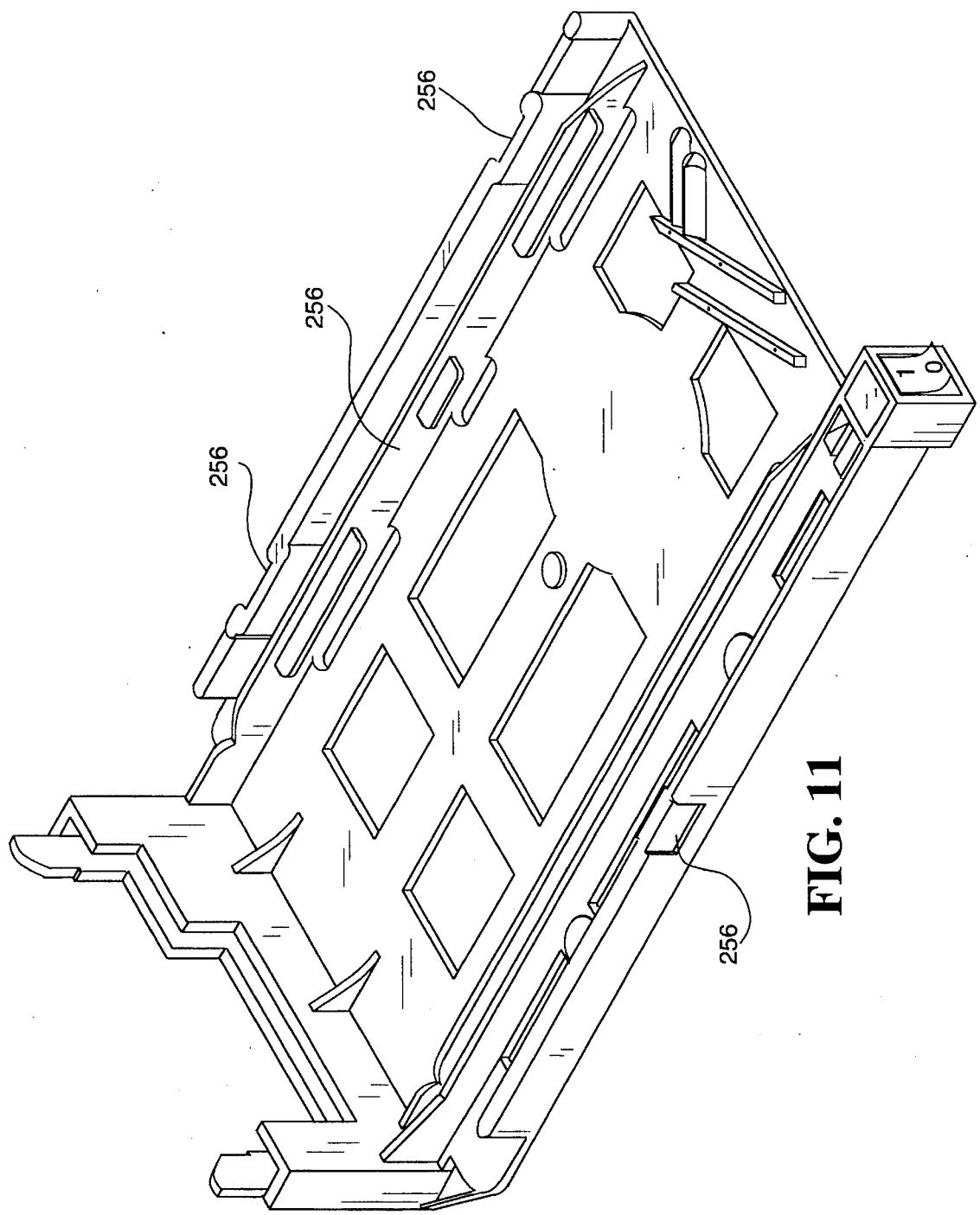

With respect to FIGS. 9–11, there is shown the universal bracket assembly, generally denoted by the numeral 250. As set forth above, universal bracket assembly 250 is the same as that described with respect to the concurrently filed application of the Applicant which has been incorporated herein by reference.

The universal bracket assembly 250 includes a slide 252 and a carrier 254. A plurality of carriers 252 are semi-permanently mounted in the frame 90 on the tabs 112 through compatible connection of the slide locking recesses 256.

It will, of course, be appreciated that other bracket assemblies could be used compatibly with the any of the above described modular enclosure assemblies in accordance with this invention. The frame 90 has a sufficient amount of slots 110, tabs 112 and holes 114 to accommodate such flexibility.

With respect to FIGS. 12 and 13, there is shown the 2 device embodiment of the enclosure 224 having a rear data interconnect 270. Each of the slides 252 has a data interconnect connector 272 which connects to one of the 50 pin IDC connectors 274 on the rear data interconnect 270 as best shown in FIG. 13.

The data interconnect 270 includes a input data connector 276 and an output data connector 278. The computer bus includes appropriate connectors for connection with the rear data interconnect 270.

With respect to FIGS. 14–17, there is shown the 4 and 7 device embodiment of the enclosure 222 and 50, respectively having a rear data interconnect 280. The operation of each of the embodiments is the same at that described with respect to FIGS. 12–13. As can be seen, the 4 device embodiment includes 4 data connectors 274 and the 7 device embodiment includes 7 data connectors 274.

With respect to FIGS. 18–19, there is shown the rear interconnect 300 of the RAID embodiment of the modular enclosure apparatus in accordance with this invention. The rear data interconnect 300 includes two pairs of 34 pin IDC connectors 302 & 304 and 306 & 308.

Each pair of the connectors 302 & 304 and 306 & 308, represent an input and an output. More particularly, connectors 302 and 304 are the input pair and 306 and 308 are the output pair.

Each of the connectors 302 & 304 and 306 & 308, are connected to the RAID controller module 130.

The RAID modular enclosure apparatus in accordance with this invention, includes alternative connection to both fast or fast and wide SCSI. As shown in FIGS. 18–19, the exterior portion 301 of the rear data interconnect 300 includes two sets of connectors 350 and 360.

Data connector pair 350 includes an input data connector 352 and an output data connector 354. Similarly, data connector pair 350 includes an input data connector 362 and an output data connector 364.

Data connector pair 350 includes two 68 pin connectors suitable for fast SCSI, but not fast and wide SCSI.

On the other hand, data connector pair 360 includes two 50 pin Centronics connectors suitable for fast and wide SCSI, but not fast SCSI.

These pairs of connectors, 350 and 360 are used alternatively, and are mutually exclusive.

Unlike the non-RAID embodiment where the slide 252 connects directly to the back plane, the RAID embodiment requires a controller. Additionally, in the RAID, power connects directly from the power supply via discrete wire to the slide power connector 255 without means for the bus.

Figure 20:
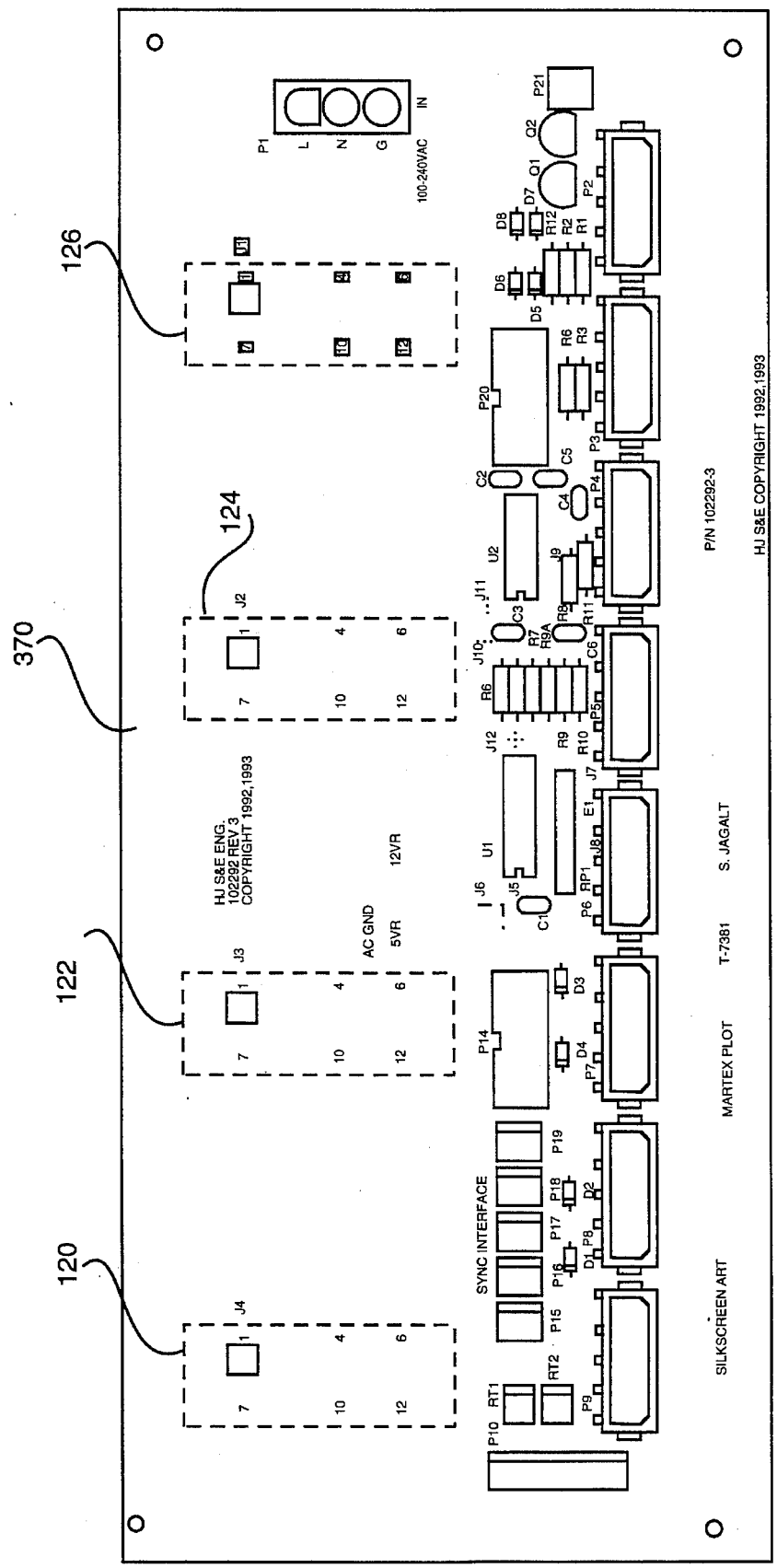
FIG. 20 is a schematic view of the back plane of the power supply module in accordance with this invention.

With respect to FIG. 20, there is shown the back plane 370 of the RAID modular enclosure apparatus in accordance with this invention. The enclosure includes power supplies 120–126 which are redundant and replaceable in nature as more fully appreciated hereinafter.

Each of the power supplies 120–126 may be 5 volts or 12 volts. For example, power supplies 120 and 122 are 12v power supplies, while power supplies 124 and 126 are 5v power supplies. It will be appreciated that in computer systems there is a need for both types of power. Each of the pairs of power supplies is capable of delivering the power required, should one of the pair fail. Thus, if power supply 120 were to fail, the system would continue to operate because power 122 would take the full load through the load sharing circuit that will be discussed in detail below. Likewise, if power supply 124 were to fail 126 would bear the full load.

Each of the 12v power supplies, 120 and 122, respectively, have identical plug in connectors (not shown) for plugging the power supplies 120 and 122 to the rear plane 370. However, these connectors are different in that, the user can not plug in the 5v power supplies 124 and 126 into the 12v spaces on the rear plane 370. Likewise, the user can not plug in the 12v power supplies 120 and 122 in the plugs of the rear plane 370 designed for the 5v power supplies 124 and 126.

The modular enclosure apparatus in accordance with this invention, will now be described with respect to its preferred electrical circuit schematics. As will be more fully appreciated hereinafter, the modular enclosure apparatus circuit includes a hot swapple interconnect contact system for allowing hot swappable exchange of electrical devices without interrupting on-line operation of the overall computer and/or computer bus.

Figure 21:
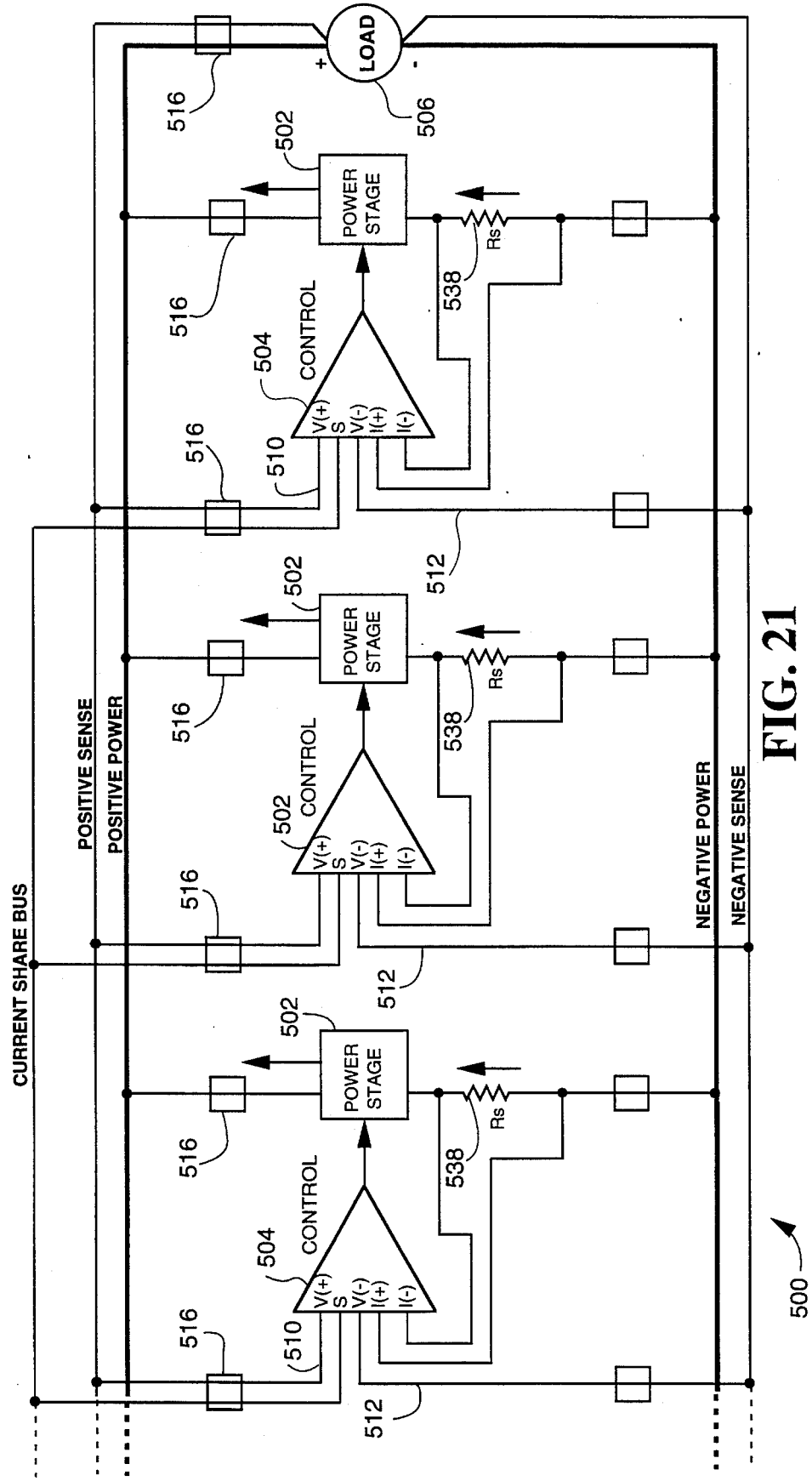
FIG. 21–23 is a circuit schematic of the power supply module in accordance with this invention, illustrating the power supply module connected to the remainder of the modular enclosure apparatus electronics.

With respect to FIG. 21, there is shown the circuit schematic of the power supply module, generally denoted by numeral 500. The power supply module circuit 500 includes a power supply 502 and a controller 504.

The controller 504 controls the modular power stage unit 502. Control is accomplished by means of voltage feedback from a load and of current feedback information from a current sensing means for each modular power stage.

The controller 504 is a Unitrode Load Share Controller UC3907 integrated circuit.

This information is in two forms, the voltage feedback and the current feedback. The voltage feedback is the differential voltage between the positive and negative terminals of a load 506. The current feedback is the voltage differential between the two terminals of a sensing resistor Rs 538.

The modular power stage 502 includes a means for transforming the raw AC input power from unregulated form and controlling it to supply regulated DC power at the desired voltage to the load 506. The voltage feedback from the load 506 is sensed by the difference between a V(+) input positive sense signal 510 and a V(-) input negative sense signal 512 of control 504.

The circuit 500 includes multiple controllers 504 and power stages 502 connected to the computer bus represented as a load 506 by means of the interconnect system contact 516. The interconnect system contact 516 allows circuit interrupt switches to be used as described above.

Figure 22:
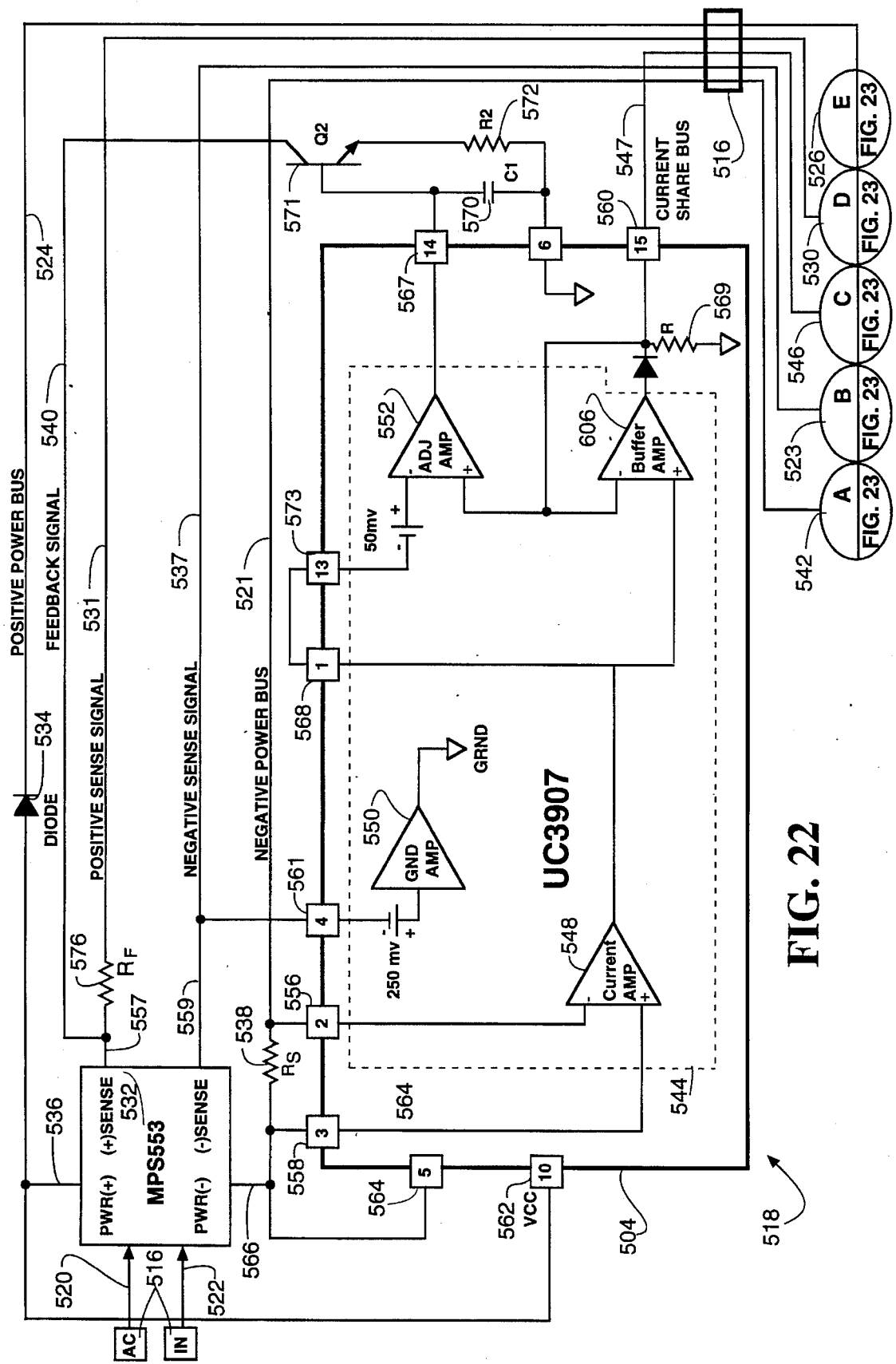
Figure 23:
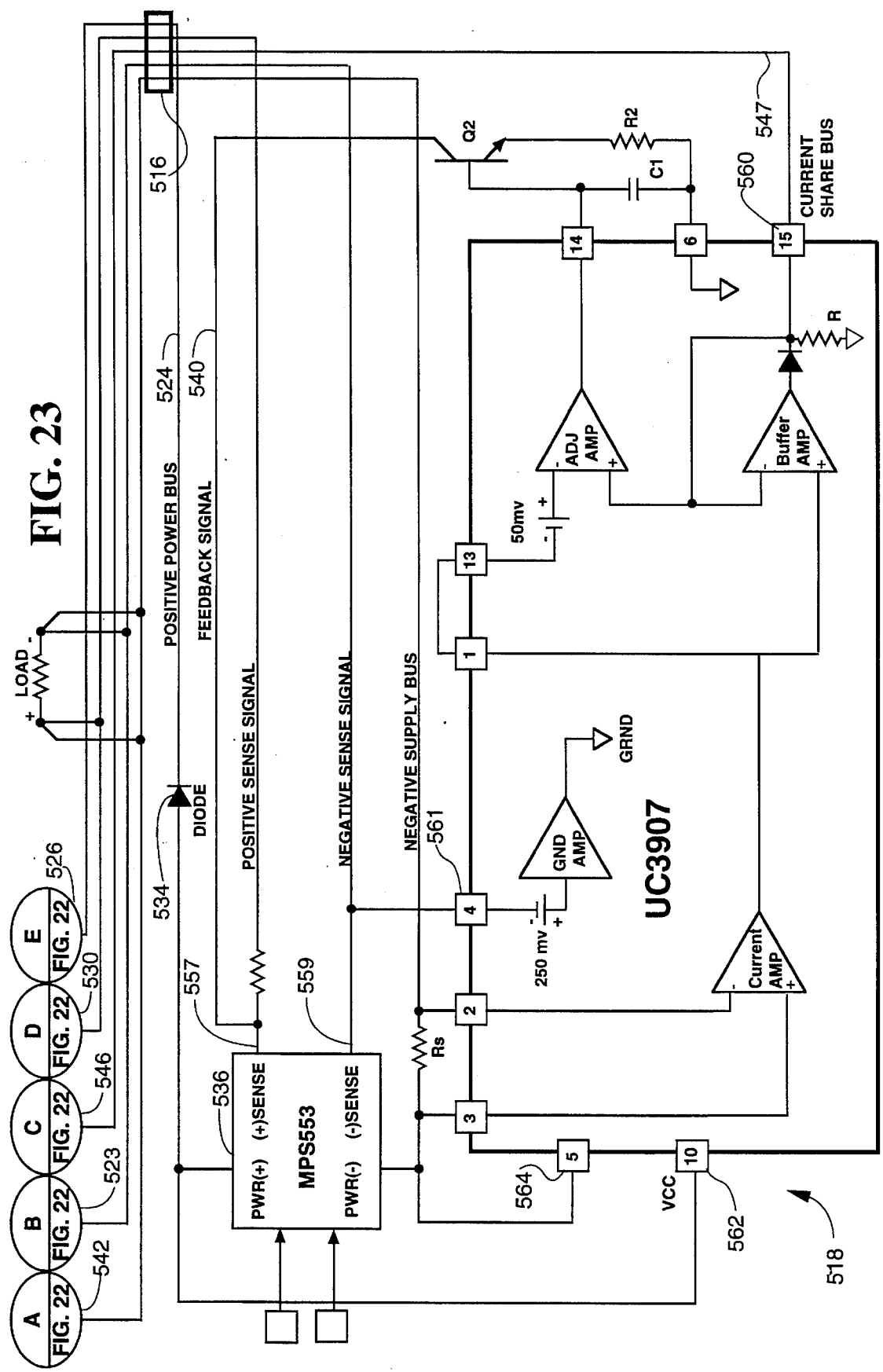

With respect to FIG. 22, there is shown a current share power supply circuit generally denoted by the numeral 518. The current share power supply circuit 518 includes the controller 504, a modular power supply stage (MPS) 532, a series isolation diode 534 with anode and cathode connections, a current sense resistor 538, an inverting transistor 590, a bypass capacitor 570, and an emitter bias resistor 574.

The MPS 532 is a Kepco Series FAW 100 watt, 12v, 8.3 amp switching power supply, model 23233. The MPS 532 has AC input connections 520 and 522, MPS (+) power connection 536, MPS (-) power connection 566, MPS (+) sense connection 557, and MPS (-) sense connection 559. The MPS AC connections 520 and 522 receive power from AC system computer bus power lines (not shown) through the hot swappable interconnect contacts 516.

The controller 504 includes a connection 564 to pin 5 Power Return of UC3907. The connection 564 is the most negative voltage available and is connected to MPS (-) power 566, to one side of sense resistor 538 and to connection 558 pin 3 of UC3907. The other side of resistor 538 is joined to pin 2 connection 556 of controller 504 and to a module negative power bus 542.

DC power for controller 504 Vcc pin 10, connection 562 is derived by connecting to MPS 532 (+) power connection 536 and to the anode of diode 534. The cathode of diode 534 connects to a module positive power bus 524.

The electrical interconnection to other modules and the system load 506 is provided by the hot swappable interconnect contact system described above.

The bias current point for the transistor Q2 571 is set by the signal from pin 14 and the resistor R2 574. The resistor R2 574 is connected to the emitter of the transistor 571 and the artificial ground pin 6 connection 572 of the UC3907. One side of a Rf feed back resistor 576 connects to the MPS 532 (+) sense connection 557, and to the feedback signal line 540 from the collector of transistor 571. The other side of resistor 576 connects to a MPS positive sense signal 531.

The UC3907 provides an adjust amplifier output pin 15 connection 560 to a module current share bus 546.

The MPS 532 (-) sense connection 559 is joined to controller 504 pin 4 connection 561 and to a module negative sense signal 537. Pin 4 of UC3907 is a high-impedance input intended to allow remote sensing of the system ground. This point is considered as the 'true' ground and all other voltages are with respect to this point.

The plurality of contacts 516 electrically join the following pairs of elements; module 532 AC power input connections 520 and 522 to the system AC bus (not shown); a module positive power bus 524 of each module of the circuit 518 to a load power bus 526; a module negative power bus 521 of each module circuit 518 to a negative load bus 542; a module positive sense signal 531 of each module of the circuit 518 to a load positive sense bus 530; a module negative sense signal 537 of each power supply of the circuit 518 to a load negative sense bus 523. A module current share bus 546 is similarly joined to a system current share bus 547.

A transistor 571 collector is connected to the positive supply terminal 536 of the modular power supply 532 and one side of resistor Rf 576. The other side of resistor 576 connects to the module positive sense bus 531. The bias current point for transistor 571 is set by the signal from pin 14 and a R2 resistor 574 connected to the emitter of the transistor 571 and artificial ground pin 6 connection 572 of circuit UC3907.

To provide the advantages of on-line replaceability of this invention, each power supply 502 and controller 504 shown in FIG. 21 is connected to the system by means of the hot pluggable mechanical and electrical interconnect contacts 516 of this invention. To provide the advantages of continued operation in the event of failure of one of the power supplies 502, the remaining supplies 502 have the capability of supplying full rated load. This is known as an N+1 redundancy.

The portion of the load current supplied by each modular power supply 532 of FIG. 22 passes through a series isolation diode 534 with its anode connected to the positive supply terminal 536 of the modular power supply and the cathode connected to the module positive power bus 524.

The cathode is connected to the load 506 and the cathodes of the other series isolation diodes in the system. The load current is returned to the power supply 532 through the current sense resistor (Rs) 538.

The sense resistor 538 Rs has one terminal connected to the modular power supply negative supply terminal 566 and the other terminal connected to the module negative power bus 521. The load negative power bus 542 is connected to the negative side of the load 506 through one of the contacts 516.

The ground return of the current share controller 504, pin 5 connection 564, is connected to the joint connection of the modular power supply negative supply terminal 566 and one terminal of Rs.

The pins 1 and 13, namely, connections 568 and 573 of the current share controller 504 are strapped together. The current share controller 504 of FIG. 2 includes a network means 544 for sensing the signal on the current share bus 546.

The operation of the UC3907 is described in the data sheet for the Unitrode Load Share Controller for the UC3907 family which provides all the necessary features to allow multiple independent power modules to be paralleled such that each module supplies only its proportionate share to total load current. That data sheet is specifically incorporated herein by reference.

Each modular power supply 532 is connected to buses 542 and 526 in similar fashion, so that the portion of the load current supplied by each modular power supply passes through its associated Rs resistor.

The current share controller 504 includes a network sub-system 544 for sensing a signal on the current share bus 546. The network 544 of this circuit includes a current amp 548, a ground amp 550, a adjust amp 552 and a buffer amp 554 inside each controller 504.

This network 544 senses the status of the current share bus 546 and adjusts the modular power supply 532 output current accordingly.

Power to operate the controller 504 is obtained by connecting current share controller 504 pin 10 connection 562 to the positive supply terminal 536 of the modular power supply 532. The ground return of the current share controller 504, pin 5 connection 564, is connected to the joint connection of the modular power supply negative supply terminal 566 and one terminal of Rs. In this embodiment, pins 1 and 13, connections 568 and 573, respectively of the controller 504 are strapped together.

The functions of the ground amplifier 550 or current amplifier 548 and the adjusting amplifier 552 of the controller 504 are described in more detail in the UC3907 data sheet and in the U.S. Pat. No. 5,157,269, "Load Current Sharing Circuit" Mark Jordan, et al, which are . both specifically incorporated herein' by reference.

The theory of operation is described in a paper by Mammano, Bob and Jordan, Mark "Load Sharing with Paralleled Power Supplies", Unitrode Power Supply Design Seminar, 1991 obtainable from Unitrode Corporation, Merrimack, NH, which is also specifically incorporated herein by reference.

The output current of the modular power supply 532 is controlled by the adjust amplifier 552 of the controller 504 through the signal from pin 14 connection 567 of the controller 504 connected to the base of a 2N2222 transistor 571.

The buffer amplifier 554 is a uni-directional buffer which drives a current share bus 546. Since the buffer amplifier 554 will only source current, it ensures that the module of the circuit 518 with the highest output current will be the 'master' and drive the current share bus 546 with a low-impedance drive. All other buffer amplifiers 554 of the modules of the circuit 518 in the system will be inactive with each exhibiting a 10 k ohm load impedance 569 to ground.

This adjust amplifier 552 compares its own module output current to a signal on module current share bus 546 which represents the highest output current. The adjust amplifier 552 has a built-in 50 mV offset 551 on its inverting (−) input which will force the unit acting as the 'master' to have a low output.

While this 50 mV offset 551 represents an error in current sharing, the gain of the current amplifier 548 reduces it to only 2.5 mV across the current sense resistor 538.

This essentially equal current sharing is accomplished by controlling each module's power stage 532 with a command generated from a voltage feedback adjust amplifier 552 whose reference can be independently adjusted in response to the common share bus voltage. By monitoring the current from each module by means of feedback from sense resistor 538, the current share bus network 544 determines which paralleled module would normally have the highest output current and designates it the 'master' module.

The modular power supply which has the highest output current acts as the 'master' for the group of supplies connected to the positive and negative supply buses 526 and 542. The other modular power supply units will receive signals from their respective controller 504 through the respective transistor 571 collectors which will cause their output currents to rise to within about 10% of the 'master' power supply stage.

The system current share bus signal 547 interconnecting all the paralleled modules is a low-impedance line, insensitive to noise and parasitic elements, which will not interfere with allowing each module to act independently should the bus become open or shorted to ground.

Another feature of this current share bus 547 is that the units current share when a signal is present, and continue to operate whether the bus is open or shorted. This is implemented with current share amplifiers 548 of the UC3907. These amplifiers compare the signal derived from the sense resistor Rs 538, pin 2 connection 556 and pin 3 connection 558 shown in FIG. 2 of each modular power supply of the circuit 518 with signal received from the current share bus 546 at pin 15 connection 560 and adjust the modular power supply 532 output at the positive supply terminal 536 as needed to drive this difference to zero.

A capacitor 570 C1 across pins 6 and 14 connections 572, 567 provides a reduction in bandwidth for improvement in noise suppression but is not essential for current share operation.

If the master MPS 532 fails to function, it will be isolated by series isolation diode 534 in series with the supply 532 positive output 536. The next highest current power supply stage will then take over as the master for the remaining units, thereby continuing an uninterrupted supply current to the load.

This concept of utilizing multiple power supplies to deliver power to a common load, as above, provides a feature wherein each supply delivers a nearly equal portion of the total power required to the load. The benefit being each supply is only required to work as hard as necessary to deliver its portion of the total power required. This results in lower operating temperatures for each supply which translates into dramatically extended operational lifetime, or Mean Time Between Failures (MTBF)

The combination of the redundant supply and control modules along with the hot pluggable interconnect contacts 516 of this invention provides the advantage of replacement and repair of failed modules without interrupting the system operation. This improves the reliability and maintainability of micro-computing systems while retaining system performance.

Figure 24:
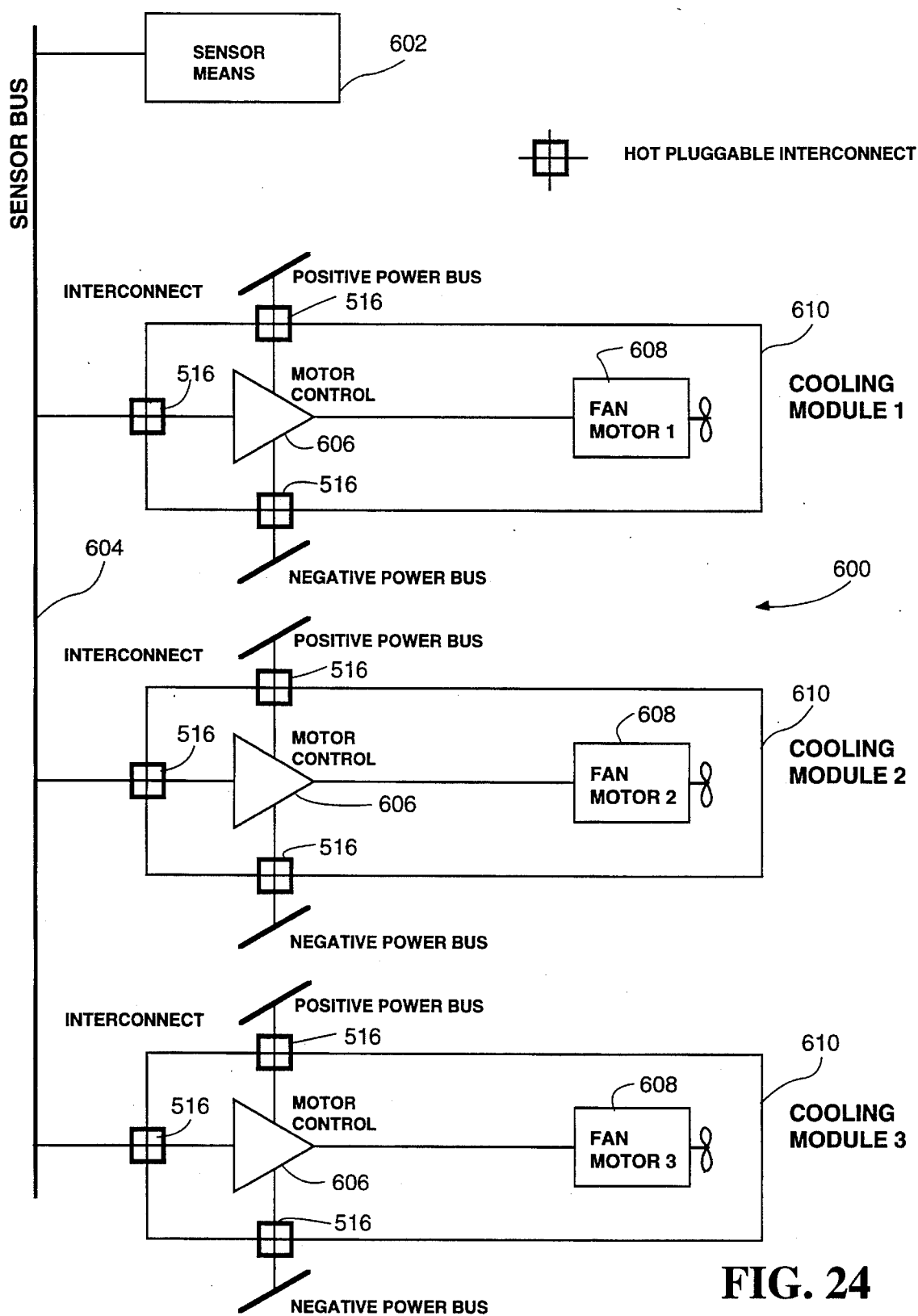
FIG. 24 is the schematic representation of the cooling module in accordance with this invention.

FIG. 24 is a circuit schematic of the cooling module 160 generally indicated by numeral 600. The circuit includes a temperature sensor 602 mounted in a suitable location of the computing platform which is sensitive to the operating temperature of the modular enclosure apparatus 50. The temperature sensor 602 is connected to a sensor bus 604.

The cooling module 160 includes a plurality of fan motor controls 606, a plurality of fan motors 608 and hot swappable interconnect contacts 516.

The cooling module 160 includes a plurality of cooling assemblies 610. Each cooling assembly 610 includes the fan motor control 606, the fan motor 608 and interconnects 516 for connecting same.

The power for the motor controls 606 of the cooling modules 610 is supplied by the system positive and negative power buses 526 and 542 through the interconnect contacts 516.

In the event of failure of one of the cooling fans 608, the corresponding change in the signal on the sensor bus 604 will be translated by the control means 606 into a signal or switching action to increase the output of the remaining modules 610 thereby stabilizing the operating temperature of the system.

This provides a measure of increased safety and reliability in the event of fan failure by sensing internal conditions within the system and controlling fan speed accordingly; i.e. slow speed when cool and higher speeds as the system temperature rises.

Other parameters could be used to monitor operating conditions, such as Cubic Feet per Minute air flow or power drain of the individual fan motors. Additional means may be provided to monitor fan performance and to sound an alarm or send a message to a computer system warning a user when performance falls below preset levels.

The mechanical and electrical hot swappable interconnect feature of this invention also provides for safely removing and replacing a failed fan without removing system power.

Figure 25:
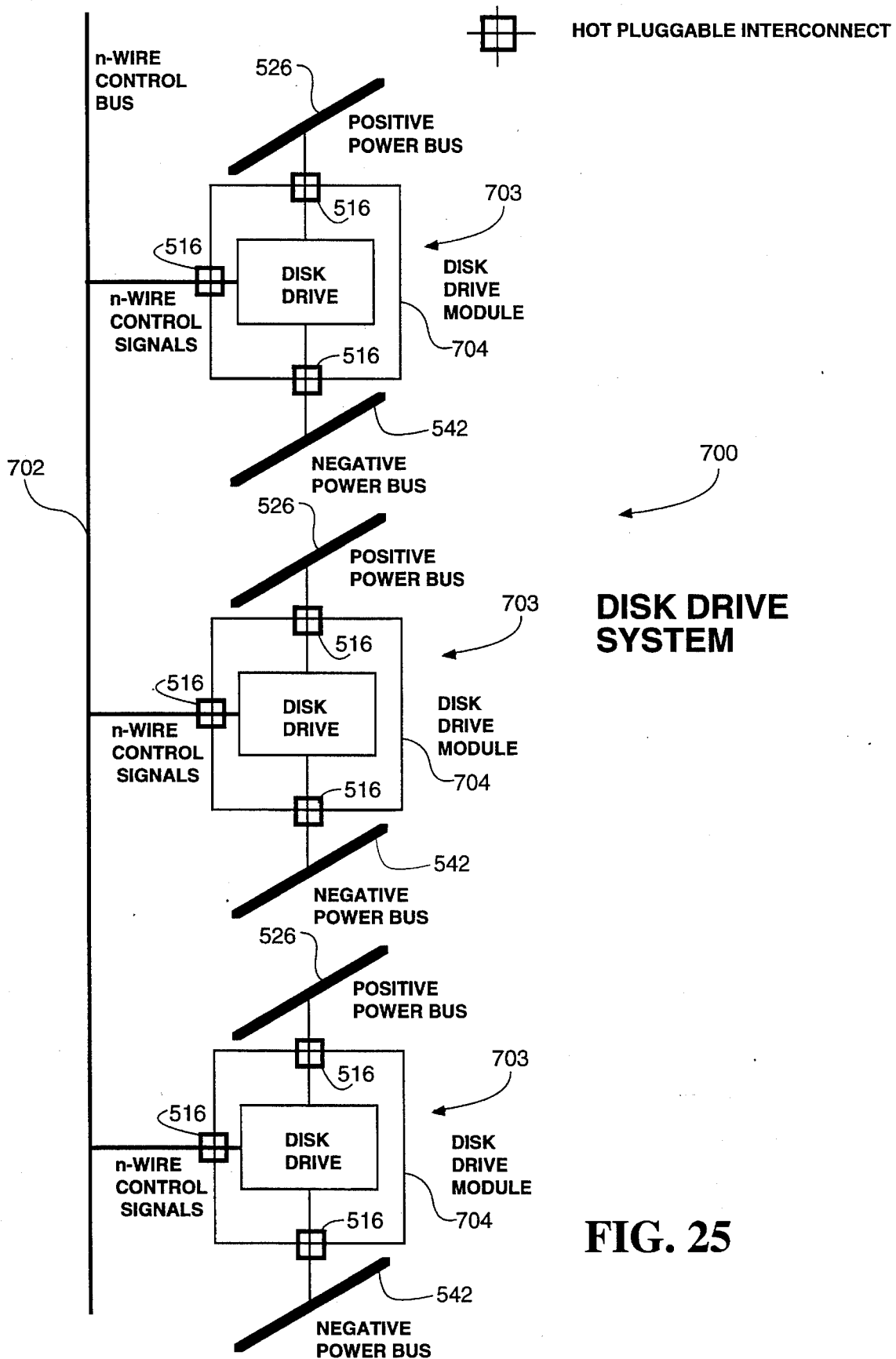
FIG. 25 is a circuit schematic of the memory storage device module in accordance with this invention, illustrating multiple redundant disk drive assemblies connected to the modular enclosure apparatus electronics.

FIG. 25 is a circuit schematic of a three device RAID system, generally denoted by numeral 700. It will be appreciated that the RAID systems may have four or five or more devices as set forth above. Of course, there must be at least two devices for the RAID system to operate.

The RAID system detects the failure of a single electrical device and sounds an alarm. The device should be replaced promptly since the failure of a second device can still cause a system failure. The system becomes non-functional if more than one device has failed. The RAID enclosure in accordance with this invention, serves to facilitate this inherent RAID weakness by providing a means for easy and rapid removal and replacement of the failed device. The RAID controller can then compensate for the replaced device while the system remains operational.

The RAID system 700 includes an n-wire control bus 702. The n-wire control bus 702 is connected to the computer processor subsystem (not shown). The n-wire control bus 702 communicates control and data signals to and from the computer bus and the disk drives.

The RAID system 700 includes memory storage device module generally denoted by the numeral 703. The memory storage device module 703 includes a plurality of memory storage devices defined by hard disk drive assemblies 704. Each module 703 is connected to the control bus 702 and the positive and negative power buses 526 and 542, respectively, as explained above with reference to FIGS. 21–22.

The hard disk drive assemblies 704 are connected to one another by the interconnect system contact 516, a hot swappable interconnect.

The presence or absence of a particular disk drive module 704 on the bus 702 is communicated by means of the bus 702 to the RAID controller. The RAID controller is provided to reliably detect changes in the status of the bus 702, alter the control and data signals, recover previous data transmissions if required, and automatically retry so that operation continues unabated. These techniques are well known in the art and do not form part of this invention.

These features provide the advantages of allowing the system to remain on-line, should a disk drive module fail, thereby allowing work to continue in normal fashion. The hot swappable interconnect system allows the system to continue to operate, without interruption, while the failed device is removed and replaced by a good one.

The hot swappable interconnect subsystem contacts 516 in combination with the redundant circuit 500, the controllable cooling subsystem 600, and RAID disk drive subsystem 700 provides the capability of removing and replacing cooling modules on line so that system performance and reliability is retained.

While the foregoing detailed description has described several embodiments of the modular enclosure apparatus in accordance with this invention, it will be appreciated that there are a variety of different modules, circuits and interconnects that would also work within the scope of this invention. Particularly, while two embodiments have been described namely, a RAID embodiment and a Non-Raid embodiment, there are other embodiments of the modular enclosure apparatus that would fall within the scope of this invention. Thus, the invention is to be limited only by the claims as set forth below.

What is claimed is:

1. A modular enclosure for connection to a computer bus for a small computer system, namely a personal computer or a computer work station, the enclosure comprising:

a housing having a base, upstanding side walls, a back and a top;

a cooling module removably connected to the enclosure for cooling the enclosure;

a frame removably connected to the housing, the frame including:

means for mounting a plurality of electrical devices within the frame, the means for mounting electrical devices includes a tab;

a memory storage device module removably connected to the frame, the memory storage device module including means for removably connecting at least one memory storage device, the means for removeably connecting at least one memory storage device includes a locking recess, the locking recess connects with the tab;

a power supply module removably connected to the frame, the power supply module including power supply means for supplying power to the enclosure;

first interconnect means for connecting the enclosure to the computer bus;

second interconnect means for connecting the memory storage device module to the first interconnect means; and third interconnect means for connecting the power supply module to the cooling module and the memory storage device module, whereby, each of the modules is removably connected, allowing any of the modules to be removed and replaced.

2. A modular enclosure as set forth in claim 1, wherein the frame is slidably connected to the housing.

3. A modular enclosure as set forth in claim 1, wherein the cooling module includes cooling means for cooling the enclosure and cooling circuit means connected to the third interconnect means for supplying power to the cooling module, the cooling circuit means including temperature sensing means for sensing the temperature of the enclosure and circuit interrupt means for interrupting the circuit, whereby the cooling means may be shut off before it is removed from the enclosure.

4. A modular enclosure as set forth in claim 3, wherein the cooling module is removably connected to the back of housing and wherein the back of the housing comprises a removable back assembly enabling the cooling module to be accessed without having to remove any other element of the modular enclosure.

5. A modular enclosure as set forth in claim 4, wherein the cooling means includes at least two fans and wherein each of the fans is capable of cooling the entire enclosure by itself and wherein each of the fans can be removed while one or more of the other fans are operating.

6. A modular enclosure as set forth in claim 5, wherein each of the fans are variable speed fans and wherein, as appropriate, the temperature sensing means directs the speed of the fans in response to the temperature of the enclosure, whereby if one of the fans fails and the temperature in the enclosure rises, the other of the fans are directed to speed up to properly cool the enclosure.

7. A modular enclosure as set forth in claim 5, wherein each of the fans has a diameter of no more than 120 mm.

8. A modular enclosure as set forth in claim 5, wherein each of the fans has a diameter of approximately 92 mm.

9. A modular enclosure as set forth in claim 1, wherein the frame comprises part of the cooling module, the frame being vented to allow air to flow therethrough.

10. A modular enclosure as set forth in claim 1, wherein the memory storage device module includes at least one memory storage device slide semi-permanently mounted in the frame mounting means and at least one carrier adapted for removable connection with the slide, the carrier adapted for connection with a memory storage device.

11. Modular enclosure as set forth in claim 10, wherein the slide includes electrical interrupt means for allowing each of the carriers to be removed from the housing while other memory storage devices present in the enclosure continue operation, defining a hot swappable memory storage device means.

12. A modular enclosure as set forth in claim 1, wherein the memory storage device module includes at least two memory storage device slides semi-permanently mounted in the frame mounting means and at least two carriers adapted for removable connection with the respective slides, the carrier adapted for connection with a memory storage device.

13. A modular enclosure as set forth in claim 10, wherein the carrier including configuration identification means for establishing a compatible connection between the memory storage device and the computer bus.

14. A enclosure as set forth in claim 1, wherein the power supply means includes two or more power supplies.

15. A enclosure as set forth in claim 14, wherein the power supply means load sharing circuit means for sharing the power load among the power supplies.

16. A modular enclosure as set forth in claim 15, wherein each of the power supplies includes circuit interrupt means for allowing each of the power supplies to be removed from the housing while other power supplies present in the enclosure continue operation, defining a hot swappable power supply means.

17. A modular enclosure as set forth in claim 16, wherein there are at least two power supplies of 12 volts, each.

18. A modular enclosure as set forth in claim 17, wherein there are at least additional two power supplies of 5 volts, each.

19. A modular enclosure as set forth in claim 14, wherein the power supplies are less than 150 watts.

20. A modular enclosure as set forth in claim 14, wherein the power supplies are less than 125 watts.

21. A modular enclosure as set forth in claim 14, wherein the power supplies are less than 110 watts.

22. A modular enclosure as set forth in claim 14, wherein the power supplies are approximately 100 watts.

23. A modular enclosure as set forth in claim 14, wherein there are two 5 v power supplies and two 12 v power supplies.

24. A modular enclosure as set forth in claim 23, wherein the modular enclosure apparatus includes a rear plane having 4 power supply connectors, one for each of the power supplies and wherein the 5 v power supplies can not fit into the 12v connectors and the 12 v power supplies can not fit into the 5 v connectors.

25. A modular enclosure for connection to a RAID computer bus for a small computer system, namely a personal computer or a computer work station, the enclosure comprising:

a housing having a base, upstanding side walls, a back and a top;

a cooling module removably connected to the enclosure for cooling the enclosure;

a frame removably connected to the housing, the frame including:

means for mounting a plurality of electrical devices within the frame, and said means for mounting a plurality of electrical devices includes a tab;

a memory storage device module removably connected to the frame, the memory storage device module including means for removably connecting at least one memory storage device, the means for removably connecting at least one memory storage device includes a locking recess connected with the tab;

a power supply module removably connected to the frame, the power supply module including power supply means for supplying power to the enclosure;

a RAID controller module removably connected to the frame, the RAID controller module includes controller module for enabling the computer means to control each of the electrical devices;

first interconnect means for connecting the enclosure to the computer bus;

second interconnect means for connecting the memory storage device module to the first interconnect means; and third interconnect means for connecting the power supply module to the cooling module and the memory storage device module, whereby, each of the modules is removably connected, allowing any of the modules to be removed and replaced.

26. A modular enclosure as set forth in claim 25, wherein the controller means comprises a pc board which is removable and replaceable without the necessity of removing any of the electrical devices connected to the enclosure.

27. A modular enclosure as set forth in claim 25, wherein the enclosure includes a rear plane having connectors adapted for fast SCSI.

28. A modular enclosure as set forth in claim 25, wherein the enclosure includes a rear plane having connectors adapted for fast and wide SCSI.

29. A modular enclosure as set forth in claim 25, wherein the enclosure includes a rear plane having connectors adapted for fast SCSI or fast and wide SCSI.

* * * * *